United States Patent
Kumar et al.

(10) Patent No.: US 10,690,995 B2
(45) Date of Patent: Jun. 23, 2020

(54) RADIATION SOURCE

(71) Applicant: ASML Netherlands B.V., Veldhoven (NL)

(72) Inventors: Nitish Kumar, Eindhoven (NL); Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/307,376

(22) PCT Filed: Jun. 1, 2017

(86) PCT No.: PCT/EP2017/063356
§ 371 (c)(1),
(2) Date: Dec. 5, 2018

(87) PCT Pub. No.: WO2017/211694
PCT Pub. Date: Dec. 14, 2017

(65) Prior Publication Data
US 2019/0302570 A1 Oct. 3, 2019

(30) Foreign Application Priority Data

Jun. 9, 2016 (EP) ..................................... 16173625

(51) Int. Cl.
*G02F 1/365* (2006.01)
*G02F 1/35* (2006.01)
(Continued)

(52) U.S. Cl.
CPC ............ *G02F 1/365* (2013.01); *G03F 9/7065* (2013.01); *H01S 3/06741* (2013.01); *G02F 2001/3528* (2013.01); *G02F 2202/32* (2013.01)

(58) Field of Classification Search
CPC .............................................. G02F 2001/3528
See application file for complete search history.

(56) References Cited

U.S. PATENT DOCUMENTS 3,958,229 A * 5/1976 Duguay ............... G02B 6/2861
  365/234
6,961,116 B2   11/2005 Den Boef et al.
(Continued)

FOREIGN PATENT DOCUMENTS

EP     1 739 493 A1    1/2007
EP     2 770 370 A2    8/2014
(Continued)

OTHER PUBLICATIONS

International Search Report directed to related International Patent Application No. PCT/EP2017/063356, dated Oct. 26, 2017; 4 pages.

(Continued)

*Primary Examiner* — Rhonda S Peace
(74) *Attorney, Agent, or Firm* — Sterne, Kessler, Goldstein & Fox P.L.L.C.

(57) ABSTRACT

A supercontinuum radiation source for an alignment mark measurement system comprises: a radiation source; illumination optics; a plurality of waveguides; and collection optics. The radiation source is operable to produce a pulsed radiation beam. The illumination optics is arranged to receive the pulsed pump radiation beam and to form a plurality of pulsed sub-beams, each pulsed sub-beam comprising a portion of the pulsed radiation beam. Each of the plurality of waveguides is arranged to receive at least one of the plurality of pulsed sub-beams beam and to broaden a spectrum of that pulsed sub-beam so as to generate a supercontinuum sub-beam. The collection optics is arranged to receive the supercontinuum sub-beam from each of the plurality of waveguides and to combine them so as to form a supercontinuum radiation beam.

14 Claims, 6 Drawing Sheets

(51) Int. Cl.
*H01S 3/067* (2006.01)
*G03F 9/00* (2006.01)

(56) References Cited

U.S. PATENT DOCUMENTS

| | | | |
|---|---|---|---|
| 7,403,293 | B2 | 7/2008 | Pellemans et al. |
| 8,508,736 | B2* | 8/2013 | Den Boef ............. G03F 9/7065 356/401 |
| 8,730,476 | B2* | 5/2014 | Den Boef ............. G03F 9/7065 356/401 |
| 9,081,302 | B2* | 7/2015 | Den Boef ............. G01N 21/47 |
| 9,110,219 | B1 | 8/2015 | Zhang et al. |
| 9,110,385 | B2* | 8/2015 | Den Boef ........... G03F 7/70625 |
| 9,276,371 | B2* | 3/2016 | Clowes ................... G02F 1/365 |
| 9,568,676 | B2 | 2/2017 | Collins et al. |
| 9,570,876 | B2* | 2/2017 | Clowes ................... G02F 1/365 |
| 9,632,039 | B2* | 4/2017 | Den Boef ............. G01B 11/00 |
| 10,067,068 | B2* | 9/2018 | Den Boef ............. G03F 9/7065 |
| 2005/0047739 | A1 | 3/2005 | Parker et al. |
| 2007/0002336 | A1 | 1/2007 | Pellemans et al. |
| 2009/0195768 | A1 | 8/2009 | Bijnen et al. |
| 2011/0069292 | A1* | 3/2011 | Den Boef ........... G03F 7/70625 355/67 |
| 2011/0085726 | A1 | 4/2011 | Den Boef et al. |
| 2012/0212749 | A1* | 8/2012 | Den Boef .......... G02B 21/0048 356/615 |
| 2014/0233091 | A1 | 8/2014 | Clowes et al. |
| 2015/0109624 | A1 | 4/2015 | Kreuzer et al. |
| 2015/0138507 | A1 | 5/2015 | Thomsen et al. |
| 2015/0227061 | A1 | 8/2015 | Tinnemans et al. |
| 2016/0268759 | A1* | 9/2016 | Clowes ................... G02F 1/365 |

FOREIGN PATENT DOCUMENTS

| | | |
|---|---|---|
| JP | 2010-245535 A | 10/2010 |
| JP | 2012-008116 A | 1/2012 |
| JP | 2016-042575 A | 3/2016 |
| TW | 2007/07088 A | 2/2007 |
| WO | WO 2013/088295 A1 | 6/2013 |
| WO | WO 2013/114259 A1 | 8/2013 |

OTHER PUBLICATIONS

International Preliminary Report on Patentability and Written Opinion of the International Searching Authority directed to related International Patent Application No. PCT/EP2017/063356, dated Dec. 11, 2018; 6 pages.

Epping et al., "On-chip visible-to-infrared supercontinuum generation with more than 495 THz spectral bandwidth," Optical Society of America, Optics Express, vol. 23, No. 15, Jul. 20, 2015; pp. 19596-19604.

Oh et al., "Supercontinuum generation in an on-chip silica waveguide," Optical Society of America, Optics Express, vol. 39, No. 4, Feb. 15, 2014; pp. 1046-1048.

"Supercontinuum Generation in Photonics Crystal Fibers," NKT Photonics, Version 2.0, Jul. 2009; 10 pages.

Omenetto et al., "Supercontinuum Generation in Sub-Centimeter Lengths of High-Nonlinearity Photonic Crystal Fibers," Nonlinear Optics, Optics and Photonics News, vol. 17, Issue 12, 2006; p. 35.

Lee et al., "Chapter 7: Interrogation Techniques for Fiber Grating Sensors and the Theory of Fiber Gratings," Fiber Optic Sensors, Second Edition, Mar. 2002; pp. 295-381.

Mayer et al., "Frequency comb offset detection using supercontinuum generation in silicon nitride waveguides," Optical Society of America, Optics Express, vol. 23, No. 12, Jun. 15, 2015; pp. 15440-15451.

Huijbregste et al., "Overlay performance with advanced ATHENA alignment strategies," Proceedings of SPIE: Metrology, Inspection, and Process Control for Microlithography XVII, vol. 5038, Jun. 2, 2003; pp. 918-928.

Pozzi et al., "Enhanced Third-Order Nonlinear Effects in Ultra-Compact AlGaAs Nanowires," Nonlinear Optics, Optics and Photonics News, vol. 17, Issue 12, 2006; p. 36.

Japanese Search Report by Registered Search Organization with English-language translation attached directed to related Japanese Patent Application No. 2018-562329, dated Dec. 18, 2019; 17 pages.

* cited by examiner

RADIATION SOURCE

CROSS REFERENCE TO RELATED APPLICATIONS

This application claims priority of EP application 16173625.1 which was filed on 2016 Jun. 9 and which is incorporated herein in its entirety by reference.

FIELD

The present invention relates to a radiation source. In particular, it relates to a radiation source that may form part of a metrology system. The radiation source may, for example, form part of an alignment system, or other position measurement system, within a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging the pattern onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which positions of alignment marks on a substrate can be measured accurately. These alignment sensors are effectively position measuring apparatuses. Different types of alignment marks and different types of alignment sensors are known e.g. are provided by different manufacturers.

There is continually a need to provide more accurate position measurements, especially to control overlay errors as product features get smaller and smaller.

It is an object of the present invention to provide an alternative radiation source which at least partially addresses one or more problems associated with prior art radiation sources, whether identified here or not.

SUMMARY

According to a first aspect of the invention, there is provided a supercontinuum radiation source comprising: illumination optics arranged to receive a pulsed pump radiation beam and to form a plurality of pulsed sub-beams, each pulsed sub-beam comprising a portion of the pulsed pump radiation beam; a plurality of waveguides each arranged to receive at least one of the plurality of pulsed sub-beams beam and to broaden a spectrum of that pulsed sub-beam so as to generate a supercontinuum sub-beam; and collection optics arranged to receive the supercontinuum sub-beam from each of the plurality of waveguides and to combine them so as to form a supercontinuum radiation beam.

Supercontinuum generation is the formation of broad continuous spectra (with a wavelength range of approximately 400 nm to 2500 nm) through propagation of short high power pulses through nonlinear media. The term supercontinuum does not cover a specific phenomenon but rather a plurality of nonlinear effects leading to considerable spectral broadening of optical pulses. The involved nonlinear effects depend on the dispersion in the material and count effects like self-phase modulation, Raman scattering, phase matching and solitons. Present supercontinuum fiber lasers comprise a high-peak-power pump source to effectively initiate nonlinear effects in optical fibers and a specific length of a photonic crystal fiber for supercontinuum generation.

The supercontinuum radiation source may be suitable for an optical measurement system, such as an alignment mark measurement system or a semiconductor inspection apparatus in general. Furthermore, the supercontinuum radiation source according to the invention may be applied advantageously in other technical fields than the technical field of lithography, such as, for example, medical tomography, measurement of fibres or component attenuation, interferometry or spectroscopy, optical coherence tomography, confocal microscopy, nanotechnology, biomedicine, consumer electronics, etc.

The first aspect of the present invention provides a radiation source that has a broad spectrum, which is particularly useful for alignment mark measurement systems. Supercontinua are formed as a result of various non-linear optical effects as the pulses of the pump radiation beam propagate through the waveguides. It will be appreciated that as used here the term "waveguide" means a structure or medium that is configured to guide a wave, in particular an electromagnetic wave. Such a waveguide may form part of an integrated optical system, i.e. it may be provided "on-chip". Alternatively, such a waveguide may be free space waveguides. Free space waveguides include various different types of optical fibres including, for example, photonic crystal fibres.

Due to the inherent non-linear nature of these effects even if the pump radiation source was stable, in which its output has substantially no pulse to pulse variations, a supercontinuum radiation source typically suffers from spectrum noise, pulse to pulse fluctuations, and unstable output modes.

The first aspect of the invention provides an arrangement wherein a plurality of supercontinua are generated (one in each of the plurality of waveguides) and are superimposed (by the collection optics). Such an arrangement is advantageous over prior art arrangements since the noise and pulse to pulse variation within the different individual supercontinua will at least partially cancel each other out. The arrangement therefore provides a broad spectrum radiation source of the type that is suitable for use in alignment mark measurement systems which requires a more stable output than prior art arrangements to allow sufficient accuracy of measurements made using such alignment mark measurement systems.

Generally, a waveguide will be able to support radiation provided that the intensity of the radiation (i.e. the power per unit area) is below a threshold value for that waveguide. If radiation having an intensity above the threshold value is coupled to the waveguide, it can be damaged. By splitting the pulsed pump radiation beam into a plurality of pulsed sub-beams, each of which propagates through a different waveguide to generate a supercontinuum, the first aspect of the present invention allows the power of the pulsed pump radiation beam to be spread over the plurality of waveguides. Thus, a passive coupling is provided of the pulsed pump radiation beam into the plurality of waveguides (i.e. without applying any (optical) amplification). This means that the cross sectional area of each of the plurality of waveguides can be reduced relative to those of the single waveguide in prior art supercontinuum sources for a given desired output power of the source. In particular, in some embodiments, even for a relatively bright radiation source (for example, with a power of the order of 1 W or above) the dimensions of the waveguides can be reduced sufficiently such that the waveguides can comprise integrated optics. That is, the waveguides may be provided on chip (e.g. as an integrated optical system) and may be formed using semiconductor fabrication techniques. The noise and pulse to pulse variation of a supercontinuum source is dependent on a number of factors, one of the main factors being the interaction length over which the non-linear processes that result in the supercontinuum generation can act. Such on chip waveguides may have smaller interaction lengths over which the non-linear processes, that result in the supercontinuum generation, can act than, for example, free space waveguides used for supercontinuum generation (for example, photonic crystal fibres). In turn, this reduces the noise and pulse to pulse variation of the supercontinuum generated by each of the plurality of waveguides relative to those of the single waveguide in prior art supercontinuum sources.

Therefore the radiation source according to the first aspect of the invention allows a double improvement in the noise and pulse to pulse variation of the radiation source. Each individual supercontinuum can be generated with a more stable output than the prior art arrangement (for a given total output power) and, furthermore, the plurality of supercontinua are combined to at least partially average out noise and pulse to pulse fluctuations.

Another advantage of the first aspect of the invention is that the supercontinuum radiation source has some level of redundancy and can still operate to some extend even in the event of failure of one of the plurality of waveguides.

The plurality of waveguides may comprise integrated optics. That is, the waveguides may be provided on chip (e.g. as integrated optical system) and may be formed using semiconductor fabrication techniques. Such on chip waveguides generally have smaller interaction lengths over which the non-linear processes, that result in the supercontinuum generation, can act than, for example, free space waveguides used for supercontinuum generation (for example, photonic crystal fibres). In turn, this reduces the noise and pulse to pulse variation of the supercontinuum generated by each of the plurality of waveguides relative to those of the single waveguide in prior art supercontinuum sources. Furthermore, the shorter interaction length, compact size, and mature fabrication techniques of integrated optics allows the supercontinuum radiation source to benefit from better mode control and polarization control over the supercontinuum radiation beam output by the supercontinuum radiation source.

The plurality of waveguides may be formed from silicon nitride ($Si_3N_4$) and may be surrounded by a cladding material or silicon or silicon dioxide ($SiO_2$).

The plurality of waveguides may be formed on a common substrate.

Each of the plurality of waveguides may have a width of the order of 1 µm or less and a height of the order of 500 nm or less. Each of the plurality of waveguides may have a length of 10 mm or less.

The supercontinuum radiation beam may have a power of at least 1 W. Known supercontinuum radiation sources with an output power of this order are possible by using, for example, a photonic crystal fibre as a non-linear optical medium. The present invention may allow for a relatively bright supercontinuum radiation source (i.e. with an output power of at least 1 W) to formed from integrated optics by providing a plurality of supercontinuum generating waveguides. Furthermore, the supercontinuum radiation source according to embodiments of the present invention provides a very compact arrangement which is, in particular, significantly smaller than known photonic crystal fibre based supercontinuum radiation sources.

The supercontinuum radiation beam may have a spectrum which comprises radiation in the wavelength range of 400 to 2600 nm. This encompasses radiation from visible light to far infrared light. The supercontinuum radiation beam may therefore have a bandwidth of around 500 THz.

The supercontinuum radiation may comprise 100 or more waveguides.

The illumination optics and/or the collection optics may be implemented by a system of waveguides.

The illumination optics and/or the collection optics may comprise a plurality of groups of waveguides, the plurality of groups of waveguides may be sequentially ordered and the waveguides from each group of waveguide may optically couple to a plurality of waveguides in the next group of waveguides in the sequence.

The illumination optics and/or collection optics may comprise a plurality of lensed fibres, each of the lensed fibres coupling to at least one of the plurality of waveguides.

The illumination optics and/or the collection optics may be implemented by a system of lenses.

The illumination optics may comprise a first optic and a focusing optic. The first optic may be arranged to receive the radiation beam from the radiation source and to direct it onto the focusing optic. The focusing optic may be arranged to optically couple a different portion of the pump radiation beam to at least two of the plurality of waveguides.

The focusing optic may comprise an array of focusing lenses, each of which is arranged to focus a different part of the pump radiation beam to a focal point at, or proximate to, an entrance to one of the plurality of waveguides.

The supercontinuum radiation beam may comprise a single mode.

The illumination optics and the collection optics may comprise a combination of integrated optics and free space optics.

According to a second aspect of the invention there is provided an optical measurement system comprising the supercontinuum radiation source according to the first aspect of the invention.

According to a third aspect of the invention there is provided an alignment mark measurement system comprising: the supercontinuum radiation source of any preceding claim; an optical system operable to project the supercontinuum radiation beam onto an alignment mark on a substrate provided on a substrate table; a sensor operable to detect radiation diffracted/scattered by the alignment mark and to output a signal containing information related to a position of the alignment mark; and a processor configured to receive the signal from the sensor and to determine a position of the alignment mark relative to the substrate table in dependence thereon.

According to a fourth aspect of the invention there is provided a lithographic apparatus comprising the alignment mark measurement system according to the third aspect of the invention.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1B:
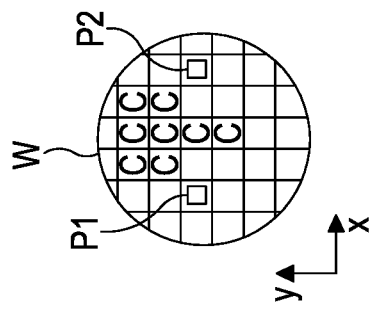
FIG. 1B shows a plan view of a substrate W which may represent either of the two substrates of FIG. 1A.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate Immersion techniques are well known in the art for increasing the numerical aperture of projection systems.

Figure 1C:
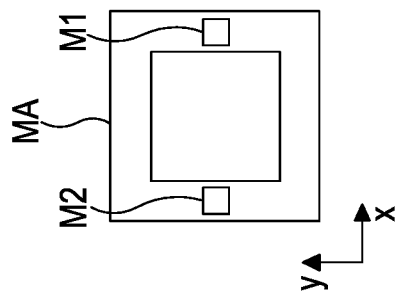
FIG. 1C shows a plan view of a patterning device, which may be used by the lithographic system of FIG. 1A.
Figure 1A:
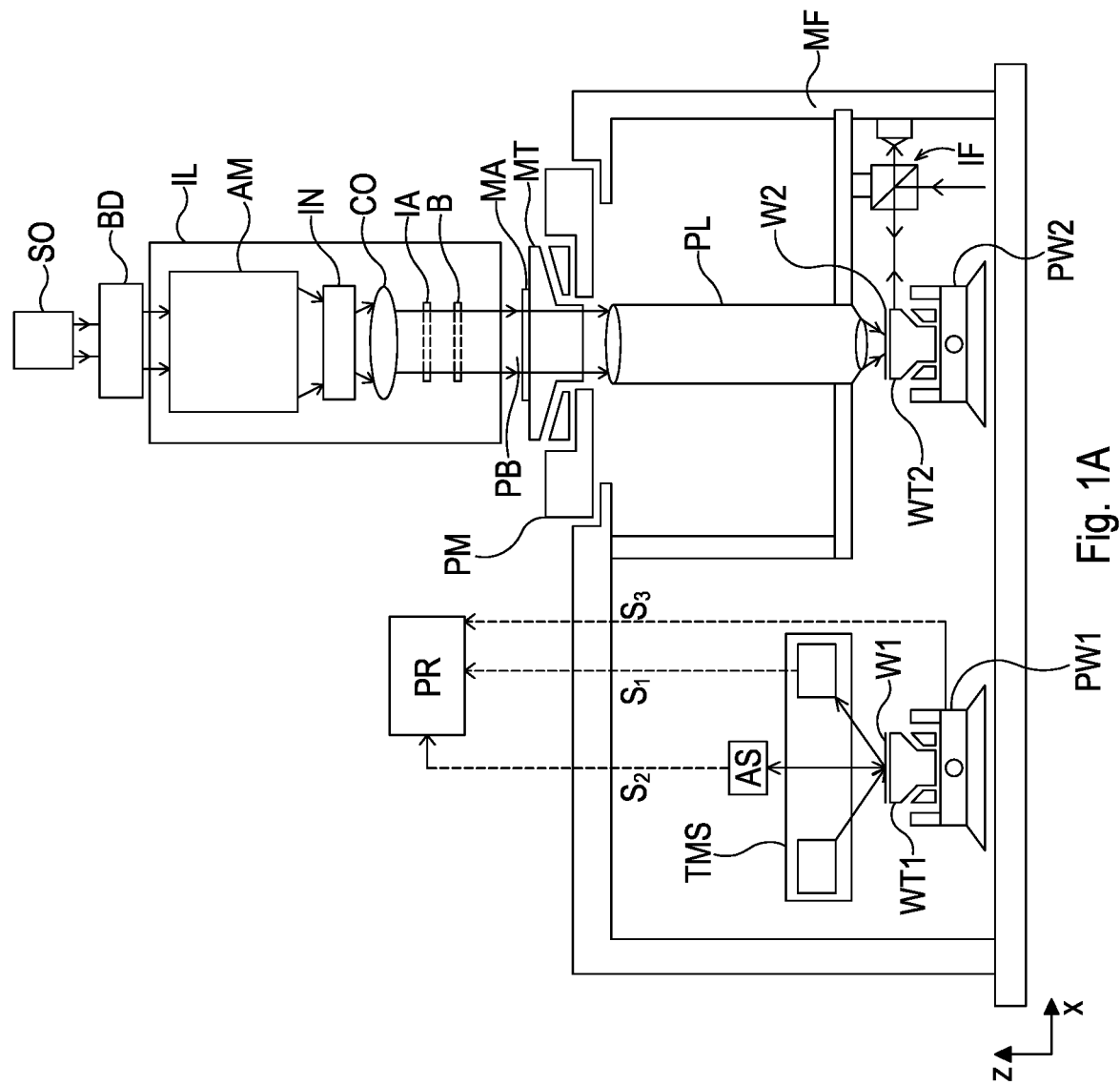
FIG. 1A schematically depicts a lithographic system comprising an alignment system according to an embodiment of the invention.

FIG. 1A schematically depicts a lithographic apparatus according to a particular embodiment of the invention. The apparatus comprises:

- an illumination system (illuminator) IL for conditioning a beam PB of radiation (e.g. UV radiation or DUV radiation);
- a frame MF;
- a support structure (e.g. a mask table) MT to support a patterning device (e.g. a mask) MA;
- two substrate tables (e.g. a wafer table) WT1, WT2, each for holding a substrate (e.g. a resist coated wafer) W1, W2 respectively; and
- a projection system (e.g. a refractive projection lens) PL configured to image a pattern imparted to the radiation beam PB by patterning device MA onto a target portion C (e.g. comprising one or more dies) of a substrate W held by one of the two substrate tables WT1, WT2.

The frame MF is a vibration isolated frame that is substantially isolated from external influences such as vibrations. For example, the frame MF may be supported by a base frame (not shown) on the ground via acoustically damping mounts (not shown), so as to isolate the frame MF from vibrations of the base frame. These acoustically damping mounts may be actively controlled to isolate vibrations which are introduced by the base frame and/or by the isolated frame MF itself.

In the dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF.

The support structure MT is movably mounted to the frame MF via a first positioning device PM. The first positioning device PM may be used to move the patterning device MA, and to accurately position it, relative to the frame MF (and the projection system PL which is connected to the frame MF).

The substrate tables WT1, WT2 are movably mounted to the frame MF via first and second substrate positioning devices PW1, PW2 respectively. The first and second substrate positioning devices PW1, PW2 may be used to move substrates W1, W2 held by substrate tables WT1, WT2 respectively, and to accurately position the substrates W1, W2, relative to the frame MF (and the projection system PL, alignment system AS and topography measurement system TMS which are connected to the frame MF). The support structure MT and the substrate tables WT1, WT2 may be referred to collectively as object tables. The first and second substrate positioning devices PW1, PW2 may each be considered to be a scanning mechanism operable to move a substrate table WT1, WT2 along a scanning path relative to the radiation beam such that the radiation beam scans across a target portion C of the substrate W.

The lithographic apparatus shown in FIG. 1A is therefore of a type having two substrate tables WT1, WT2, which may be referred to as a dual stage apparatus. In such "multiple stage" machines the two substrate tables WT1, WT2 are used in parallel, with preparatory steps being carried out on one of the substrates tables while the other substrate table is being used for exposure. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

In FIG. 1A, the substrate table WT1 is disposed on the left and the substrate table WT2 is disposed on the right. In this configuration, substrate table WT1 can be used to carry out various preparatory steps in relation to the substrate W1 held thereby using alignment system AS (as will be described more fully below) and topography measurement system TMS prior to exposure of that substrate W1. Simultaneously, the substrate table WT2 can be used for exposure of another substrate W2 held by substrate table WT2. Once the substrate W2 held by substrate table WT2 has been exposed and the preparatory steps in relation to the substrate W1 held by substrate table WT1 have been carried out, the two substrate tables WT1, WT2 swap places. Subsequently, the substrate W1 held by substrate table WT1 is exposed to radiation and the substrate W2 held by substrate table WT2 that has previously been exposed to radiation is replaced with a new substrate and various preparatory steps are performed in relation to the new substrate.

Therefore each of the two substrate tables WT1, WT2 can be disposed either on the left or the right of FIG. 1A. Unless stated otherwise, in the following substrate table WT1 will generally refer to the substrate table with is at that time disposed on the left and substrate table WT2 will generally refer to the substrate table with is at that time disposed on the right.

FIG. 1B shows a plan view of a substrate W which may represent either of the two substrates W1, W2 of FIG. 1A. In the following, unless otherwise stated, substrates on the left and right of the lithographic apparatus will be referred to as substrate W. FIG. 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as G-outer and G-inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (y direction in FIG. 1) and the length of the slit may correspond to a non-scanning direction (x direction in FIG. 1). In a scan mode, the length of the slit limits the extent in the non-scanning direction of the target portion C that can be exposed in a single dynamic exposure. In contrast, the extent in the scanning direction of the target portion C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. The terms "slit profile", "profile of the radiation beam", "intensity profile" and "profile" may be used interchangeably to refer to the shape of the (spatial) intensity distribution of the slit, especially in the scanning direction.

The illuminator IL comprises two masking blades (shown schematically in FIG. 1A as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it blocks the radiation beam PB. The masking blades are disposed in a field plane of the illuminator IL. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

The illuminator IL comprises an intensity adjustor IA (shown schematically in FIG. 1A). The intensity adjustor IA is operable to attenuate the radiation beam on opposing sides of the radiation beam, as now described. The intensity adjustor IA comprises a plurality of movable fingers arranged in pairs, each pair comprising one finger on each side of the slit (i.e. each pair of fingers is separated in the y-direction). The pairs of fingers are arranged along the length of the slit (i.e. extending in the x-direction). Each movable finger is independently movable in the scanning direction (y-direction). That is, the fingers are moveable in a direction perpendicular to the length of the slit. In use, each movable finger is independently movable in the scanning direction. For example, each movable finger may be movable between at least a retracted position wherein it is not disposed in the path of the radiation beam and an inserted position wherein it partially blocks the radiation beam. By moving the fingers, the shape and/or the intensity distribution of the slit can be adjusted.

The field may be in the penumbra of the fingers such that the fingers do not sharply cut off the radiation beam PB. The pairs of fingers may be used to apply a different level of attenuation of the radiation beam PB along the length of the slit.

The fingers may, for example, be used to ensure that the integral of the intensity profile of the radiation beam PB across the width of the slit is substantially constant along the length of the slit.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second substrate positioning device PW2 and position sensor IF (e.g. an interferometric device), the substrate table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks P1, P2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT, relative to the beam of radiation PB that has been conditioned by the illuminator IL, along a scanning path. In an embodiment, the support structure MT is moved linearly in a scanning direction at a constant scan velocity $v_{MT}$. As described above, the slit is orientated such that its width extends in the scanning direction (which coincides with the y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT2.

In order to form an image of the patterning device MA on the substrate W, the substrate table WT2 is moved such that the conjugate point in the plane of the substrate W of each point on the patterning device MA remains stationary with respect to the substrate W. The velocity (both magnitude and direction) of the substrate table WT2 relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT2 should be moved in the opposite direction to the support structure MT. That is, the motion of the substrate table WT2 should be anti-parallel to the motion of the support structure MT. Further, if the projection system PL applies a reduction factor α to the radiation beam PB then the distance travelled by each conjugate point in a given time period will be less than that travelled by the corresponding point on the patterning device by a factor of α. Therefore the magnitude of the velocity $|v_{WT}|$ of the substrate table WT2 should be $|v_{MT}\nabla\alpha|$.

During exposure of a target portion C, the masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus.

Using the scan mode, the lithographic apparatus is operable to expose a target portion C of the substrate W with substantially fixed area to radiation. For example, the target portion C may comprise part of, one or several dies. A single wafer may be exposed to radiation in a plurality of steps, each step involving the exposure of a target portion C followed by a movement of the substrate W. After exposure of a first target portion C, the lithographic apparatus may be operable to move the substrate W relative to the projection system PL so that another target portion C can be exposed to radiation. For example, between exposures of two different target portions C on the substrate W, the substrate table WT2 may be operable to move the substrate W so as to position the next target portion so that it is ready to be scanned through the exposure region.

Alternatively, the depicted apparatus can be used in another mode, wherein the support structure MT is kept essentially stationary holding a programmable patterning device, and the substrate table WT2 is moved or scanned while a pattern imparted to the beam PB is projected onto a target portion C. In this mode, generally a pulsed radiation source is employed and the programmable patterning device is updated as required after each movement of the substrate table WT2 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described further below, the alignment system AS measures the positions of alignment marks provided on the substrate W (schematically depicted by boxes P1, P2 in FIG. 1B) which is held on left-hand substrate table WT1. In addition, the topography measurement system TMS is used to measure the topography of a surface of the substrate W held on left-hand substrate table WT1. The first substrate positioning device PW1 and a position sensor (which is not explicitly depicted in FIG. 1A) can be used to accurately position the substrate table WT1 relative to the frame MF (and the alignment system AS and the topography measurement system TMS connected thereto).

The topography measurement system TMS may be operable to output a signal $s_1$ that is indicative of the height of the substrate W1. The alignment sensor AS may be operable to output a signal $s_2$ that is indicative of the position of one or more alignment marks on the substrate W1 or the substrate table WT1. The output signals $s_1$, $s_2$ are received by a processor PR.

The signal $s_1$ output by the topography measurement system TMS may be analyzed by processor PR to determine the height of the substrate W1. The processor PR may be used to generate a map of the topography of the substrate W1. The processor PR may comprise a memory and may be operable to store information relating to the topography of the entire substrate W1. The topography of the surface of a substrate W1 may be referred to as a height map. During exposure of a substrate W (on the right-hand side of FIG. 1A) it is desirable to keep the substrate W in a focal plane of the projection system PL. In order to achieve this, the substrate table WT2 may be moved in the z direction, said movement of the substrate table WT2 being determined in dependence on the topography of the surface of a substrate W (as previously determined by the topography measurement system TMS).

The signal $s_2$ output by the alignment sensor AS may be analyzed by processor PR to determine the positions of one or more alignment marks on the substrate W1 and the substrate table WT1. The first substrate positioning device PW1 may be operable to move the substrate table WT1 so as to position each alignment mark below the alignment sensor AS in turn while a position sensor IF (either position sensor IF or another position sensor dedicated to the measurement station) measures the substrate table WT1. As an initial step, the first substrate positioning device PW1 may be used to position one or more alignment marks on the substrate table WT1 below the alignment sensor AS and the position of each of the alignment marks is determined. Subsequently, the first substrate positioning device PW1 may be used to position one or more alignment marks on the substrate W1 below the alignment sensor AS and the position of each of the alignment marks is determined. For example, the position of the substrate table WT1 as determined by the position sensor may be recorded while each alignment mark is directly below the alignment sensor AS. Effectively, the measurement of the position of the alignment marks on the substrate table WT1 allows the position of the substrate table WT1 as determined by the position sensor (for example sensor IF) to be calibrated (relative to the frame MF to which the alignment system AS is connected). Measurement of the position of the alignment marks on the substrate W1 allows the position of the substrate W1 relative to the substrate table WT1 to be determined.

The processor PR may be considered to be a digital signal processing system. The processor PR may comprise, e.g., one or more microprocessors or one or more Field-Programmable Gate Arrays (FPGA), etc.

In addition to data from the alignment system AS and the topography measurement system TMS, the processor PR also receives substrate table WT1 position information (see signal $s_3$ in FIG. 1A) from first substrate positioning device PW1 and/or from a position sensor (for example sensor IF). Since the substrate is fixed to (typically via a clamp) the substrate table WT1, the information from the alignment sensor AS can be used to convert position information relating to the substrate table WT1 to position information relating to the substrate W.

The apparatus may comprise a lithographic apparatus control unit (not shown) which controls all of the movements and measurements of the various actuators and sensors described. The lithographic apparatus control unit may include signal processing and data processing capacity to implement desired calculations relevant to the operation of the apparatus. The processor PR may form part of the lithographic apparatus control unit. In practice, lithographic apparatus control unit may be realized as a system of many sub-units, each handling the real-time data acquisition, processing and control of a subsystem or component within the apparatus. For example, one processing subsystem may be dedicated to servo control of the first and second substrate positioning devices PW1, PW2. Separate units may even handle coarse and fine actuators, or different axes. Another unit might be dedicated to the readout of the position sensor IF (and, if used, another position sensor for the measurement station). Overall control of the apparatus may be controlled by a central processing unit, communicating with these sub-systems processing units, with operators and with other apparatuses involved in the lithographic manufacturing process.

Figure 2:
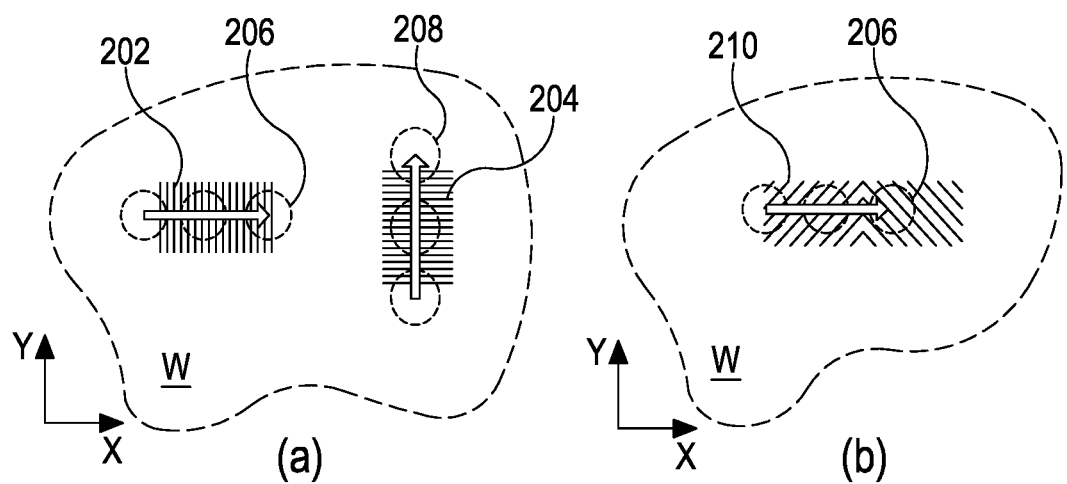
FIG. 2, comprising FIG. 2(a) and FIG. 2(b), schematically depicts various forms of an alignment mark that may be provided on a substrate in the apparatus of FIG. 1.

FIG. 2(a) shows examples of alignment marks 202, 204, provided on substrate W for the measurement of X-position and Y-position, respectively. Each alignment mark in this example comprises a series of bars formed in a product layer or other layer applied to or etched into the substrate. The bars are regularly spaced and act as grating lines so that the alignment mark may be regarded as a diffraction grating with a sufficiently well-known spatial period (pitch). The bars on the X-direction alignment mark 202 are parallel to the Y-axis to provide periodicity in the X direction, while the bars of the Y-direction alignment mark 204 are parallel to the X-axis to provide periodicity in the Y direction. The alignment sensor AS (shown in FIG. 1) scans each alignment mark optically with a spot 206 (X direction), 208 (Y direction) of radiation, to obtain a periodically-varying signal, such as a sine wave. The phase of this signal is analysed, to measure the position of the alignment mark, and hence of substrate W, relative to the alignment sensor, which in turn is fixed relative to the frame MF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Alignment marks of different pitches may also be used for this purpose. These techniques are again well known to the person skilled in the art, and will not be detailed herein. The design and operation of such sensors is well known in the art, and each lithographic apparatus may have its own design of sensor. The alignment sensor AS may be generally of the form described in U.S. Pat. No. 6,961, 116 (den Boef et al). FIG. 2(b) shows a modified alignment mark for use with a similar alignment system, which X- and Y-positions can be obtained through a single optical scan with the illumination spot 206 or 208. The alignment mark 210 has bars arranged at 45 degrees to both the X- and Y-axes. This combined X- and Y-measurement may be performed using the techniques described in published patent application US 2009/195768 A (Bijnen et al).

Figure 3:
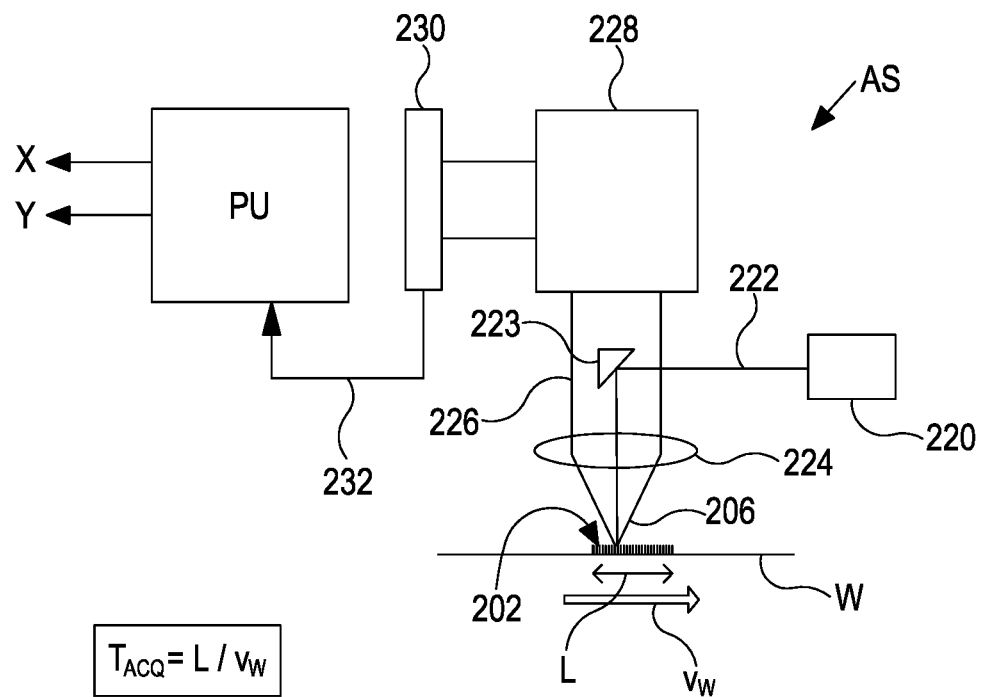
FIG. 3 is a schematic block diagram of a first alignment sensor scanning an alignment mark in the apparatus of FIG. 1.

FIG. 3 is a schematic block diagram of a known alignment sensor AS. Illumination source 220 provides a beam 222 of radiation of one or more wavelengths, which is diverted by a spot mirror 223 through an objective lens 224 onto an alignment mark, such as alignment mark 202, located on substrate W. As indicated schematically in FIG. 2, in the example of the present alignment sensor based on U.S. Pat. No. 6,961,116 mentioned above, the illumination spot 206 by which the alignment mark 202 is illuminated may be slightly smaller in diameter then the width of the alignment mark itself.

Radiation diffracted by the alignment mark 202 is picked up by an objective lens 224 and collimated into an information-carrying beam 226. A self-referencing interferometer 228 is of the type disclosed in U.S. Pat. No. 6,961,116 mentioned above, and processes beam 226 and outputs separate beams (for each wavelength) onto a sensor array 230. The spot mirror 223 serves conveniently as a zero order stop at this point, so that the information carrying beam 226 comprises only higher order diffracted radiation from the alignment mark 202 (this is not essential to the measurement, but improves signal to noise ratios). Intensity signals 232 from individual sensors in a sensor grid 230 are provided to a processing unit PU, which may form part of the processor PR of FIG. 1. By a combination of optical processing in the block 228 and computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the alignment mark within a certain range corresponding to one pitch of the alignment mark. Coarser measurement techniques are used in conjunction with this to identify which period of the sine wave is the one containing the marked position. The same process at coarser and/or finer levels may be repeated at different wavelengths for increased accuracy and/or for robust detection of the alignment mark irrespective of the materials from which the alignment mark is made, and materials on and/or below which it sits. The wavelengths may be multiplexed and de-multiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to alignment mark asymmetry.

Referring to the measurement process in more detail, an arrow labelled $V_W$ in FIG. 3 illustrates a scanning velocity with which spot 206 traverses a length L of the alignment mark 202. In this example, the alignment sensor AS and spot 206 in reality remain stationary, while it is the substrate W that moves with velocity $V_W$. The alignment sensor can thus be mounted rigidly and accurately to the reference frame RF (FIG. 1), while effectively scanning the alignment mark 202 in a direction opposite to the direction of movement of substrate W. The substrate W is controlled in this movement by its mounting on the substrate table WT and the substrate positioning system PW. All movements shown are parallel to the X axis. Similar actions apply for scanning the alignment mark 204 with spot 208 in the Y direction.

As discussed in the published patent application US 2012-0212749 A1, the high productivity requirements required of the lithographic apparatus require the measurement of the alignment marks at numerous positions on the substrate to be performed as quickly as possible, which implies that the scanning velocity $V_W$ is fast, and the time $T_{ACQ}$ available for acquisition of each alignment mark position is correspondingly short. In simplistic terms, the formula $T_{ACQ}=L/V_W$ applies. The prior application US 2012-0212749 A1 describes a technique to impart an opposite scanning motion of the spot, so as to lengthen the acquisition time. The same scanning spot techniques can be applied in sensors and methods of the type disclosed herein, if desired.

Figure 4:
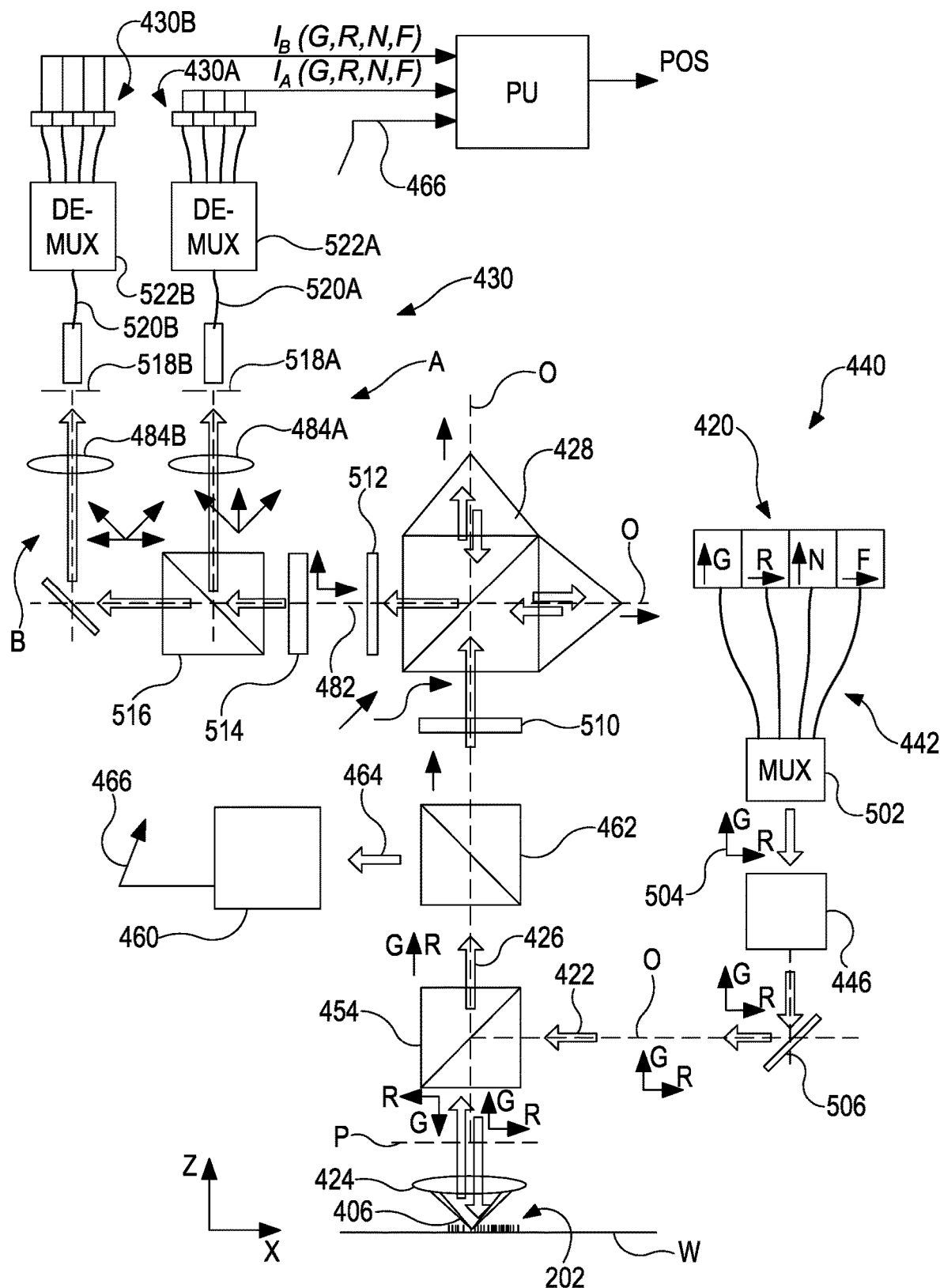
FIG. 4 is a schematic diagram of a second alignment sensor which may be used as the alignment sensor in the apparatus of FIG. 1, including off-axis illumination and an optional asymmetry measuring arrangement (not shown in detail) and further showing features of multiple wavelengths and polarization.

FIG. 4 illustrates an optical system of an alignment sensor that is a modified version of one described in the prior publications U.S. Pat. No. 6,961,116 and US 2009/195768 mentioned above. This introduces the option of off-axis illumination modes which, among other things, allow a reduced pitch of alignment mark for greater accuracy. The optical system may also allow scatterometry type measurements to be performed with the alignment sensor, rather then with a separate scatterometer instrument. In FIG. 4, for simplicity the details of providing off-axis and on-axis modes of illumination are omitted. For the present disclosure it is more interesting to show details of the multiple wavelengths and polarizations.

An optical axis O which has several branches is indicated by a broken line running throughout the optical system shown in FIG. 4. For ease of comparison with the schematic diagram of FIG. 3, some parts of the optical system shown in FIG. 4 are labelled with reference signs similar to those used in FIG. 3, but with prefix "4" instead of "2". Thus, we see a light source 420, an illumination beam 422, an objective lens 424, an information carrying beam 426, a self-referencing interferometer 428 and a detector arrangement 430. Signals from the detector arrangement are processed by processing unit PU, which is modified so as to implement the novel features described below and to output an (improved) position measurement POS for each alignment mark.

Additional components illustrated in this more detailed schematic diagram are as follows. In an illumination subsystem 440, radiation from source 420 is delivered via optical fibres 442 to an illumination profiling optics 446. This delivers input beam 422 via beam splitter 454 to objective lens 424 having a pupil plane P. Objective lens 424 forms a spot 406 on alignment mark 202/204/210 on the wafer W. Information-carrying beam 426, diffracted by the alignment mark, passes through beam splitter 454 to interferometer 428. Interferometer 428 splits the information carrying beam into two parts with orthogonal polarization, rotates these parts about the optical axis by 180° relative to one another, and combines them into an outgoing beam 482. The outgoing beam 482 enters the detector arrangement 430 as will be described in more detail below.

Included in the present example is an asymmetry measuring arrangement 460. Arrangement 460 receives a part 464 of the information carrying beam 426 through a second beam splitter 462 positioned in advance of the interferometer. Another patent application, US 20125227061, describes techniques for the measurement of asymmetry using position information obtained through the detector 430. It will be appreciated that the asymmetry measuring arrangement 460 is optional and may therefore be omitted in other embodiments.

Illumination profiling optics 446 can take various forms, some of which are disclosed in more detail in prior patent application US 2015109624. In the examples disclosed therein, alignment sensors (more generally, position measuring apparatuses) are shown which allow the use of reduced grating pitches without the need for spatial resolution on the detector side. By use of illumination modes, these apparatuses are able to measure the positions of alignment marks with a wide range of different pitches, for example from less than 1 µm to pitches of 20 µm, without changing the current detector design. A particular feature common to the examples described in the prior application US 2015109624, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially λ/NA to substantially λ/2NA, where λ is the wavelength of radiation used, and NA is the numerical aperture of an objective lens of the instrument (e.g. the alignment sensor or more generally the position measuring apparatus). The examples described in the prior application US 2015109624, also use a particular distribution of spot mirrors in a beam splitter of the apparatus, which can both provide the desired illumination and act as a field stop for zero order diffracted radiation. A 'universal' illumination profile can be designed that allows for aligning on any of the X, Y and XY alignment marks without changing the illumination mode, although this inevitably brings some compromise in performance and/or some complication in the apparatus. Alternatively, dedicated modes can be designed and made to be selectable for use with the different alignment mark types. Different polarizations of illumination can be selected also.

The apparatus as a whole need not be limited to providing these particular off-axis illumination profiles. It may have other modes of use, both known or yet to be developed, which favour the use of different profiles. For example, the apparatus may provide for selection of on- and off-axis illumination modes for the different alignment mark types shown in FIGS. 2(a) and (b). While off-axis illumination is of interest for use with finer gratings, an on-axis illumination profile may be useful for compatibility with existing alignment marks and measurement methods. Referring firstly to the example of an on-axis mode, as used in the known sensor of FIG. 3, illumination normal to the substrate is provided by an on-axis illumination profile having a central bright spot within an otherwise dark pupil. This profile is an optional setting in the illumination beam 422 of the apparatus. In this example, it is desired for the zero order beam which returns along the optical axis to be blocked before entry into the interferometer 428, but also for it to be transferred to the asymmetry measuring arrangement 460 (when provided). To block the zero order before the interferometer 428 is not essential, but improves the signal to noise ratio of the position signal. Accordingly, in this embodiment, a spot mirror may be included in the second beam splitter 462. The first splitter 454 is not silvered, and one accepts that only 50% or so of the intensity of the central spot may is transferred to the alignment mark. In an alternative embodiment, where the arrangement 460 is omitted, this profile may be produced directly by illumination profiler 446 and transmitted at full intensity to objective 424 by a spot mirror within the first beam splitter 454. A variety of alternatives can be envisaged to obtain a desired profile.

Off-axis illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be very short. Even with a monochromatic laser source, U.S. Pat. No. 6,961,116 teaches that a short coherence time is preferred, for example to eliminate interference from undesired multiple reflections. Consequently, optical path lengths from the source to each segment should be very closely matched. An aperture corresponding directly to the desired profile could be placed in a widened parallel beam, but that would result in a relatively large light loss. To circumvent the loss of light, various alternative solutions are provided in the prior application US 2015109624, mentioned above.

The illumination emerging from the illumination source 442 may be monochromatic but is typically broadband in nature, for example white light, or polychromatic. It will be appreciated that the illumination source 442 is a source operable to emit electromagnetic radiation. This radiation may comprise visible light and/or electromagnetic radiation outside of the visible spectrum, for example infrared radiation. It will be appreciated that in the following the term "radiation" is synonymous with the term "light" and may be used interchangeably. Similarly, a wavelength (or range of wavelengths) of such radiation may be referred to as the "colour" of the radiation whether the radiation is from the visible spectrum or not. A diversity of wavelengths in the beam increases the robustness of the measurement, as is known. One known sensor uses for example a set of four wavelengths, each of the four wavelengths being in the range 500 nm to 900 nm. These four wavelengths may be referred to by the name of their colours, which may be: green (comprising green light), red (comprising red light), near infrared (comprising radiation in the near infrared) and far infrared (comprising radiation in the far infrared). In a sensor implementing the present invention, the same four wavelengths could be used, or a different four, or more or fewer than four wavelengths might be used.

Referring to FIG. 4 again, aspects of the apparatus concerned with measurement using multiple wavelengths of radiation, and concerned with the management of polarization effects, will now be explained. In the illumination subsystem 440, the source 420 comprises four individual light sources that are provided to produce radiation of four wavelengths named green (labelled G), red (R), near infrared (N) and far infrared (F). For convenience in the following discussion, the radiation at these four different wavelengths will be called four colours of light, it being immaterial for present purposes whether they are in the visible or non-visible parts of the electromagnetic spectrum. The light sources are linearly polarized, with the G and N radiation being oriented the same as one another, and the R and F radiation being polarized orthogonally to the polarization of the G and N radiation.

The four colours are transported by polarization maintaining fibres to a multiplexer 502, where these are combined into a single four-colour beam. The multiplexer maintains linear polarization, as indicated by arrows 504. The arrows 504 and similar arrows throughout the diagram are labelled G and R to indicate polarization of the green and red components. The N and F components are oriented the same as the G and R components, respectively.

This combined beam enters via suitable delivery optics 506 into beam splitter 454. As already described, it then reflects from a partially- or fully reflecting surface (e.g. a 0.5 mm diameter spot mirror), which is inside the beam splitter. The objective lens 424 focuses the beam to a narrow beam which is reflected and diffracted by the grating formed by alignment mark 202 on the wafer W. Light is collected by objective lens 424, with for example a numerical aperture NA=0.6. This NA value allows at least ten orders of diffraction to be collected from a grating with 16 µm pitch, for each of the colours.

The reflected and diffracted light forming information carrying beam 426 is then guided to the self-referencing interferometer 428. In this example, as already described, the beam is split by beam splitter 462 to supply a portion 464 of the information carrying beam to the asymmetry measuring arrangement 460, when provided. Signals 466 conveying asymmetry measurement information are passed from arrangement 460 to the processing unit PU. Just before the interferometer, polarization is rotated by 45° by a half wave plate 510. From this point on, polarization arrows are shown for only one colour, for clarity. The interferometer, as already described above and in the U.S. Pat. No. 6,961,116, comprises a polarizing beam splitter, where half of each colour is transmitted, and half of each colour reflected. Each half is then reflected three times inside the interferometer, rotating the radiation field by +90° and −90°, giving a relative rotation of 180°. The two fields are then superimposed on top of each other and allowed to interfere. A phase compensator 512 is present to compensate for path differences of the −90° and 90° image. The polarization is then rotated 45° by another half wave plate 514 (having its major axis set at 22.5° to the X or Y axis). The half wave plates 510, 514 are wavelength insensitive, so that polarizations of all four wavelengths are rotated by 45°.

A further beam splitter 516 splits the optical signal into two paths designated A and B. One path contains the sum of the two rotated fields, and the other contains the difference. Depending on the initial polarization direction, the sum ends up in Path A or Path B. So in this example the sum signals for Green and NIR signals end up in one path, Red and FIR in the other. For each colour, the corresponding difference signal ends up in the other path. It will be appreciated that a radiation source is a source operable to emit radiation, for example electromagnetic radiation. The radiation may comprise visible light. Alternatively, the radiation may comprise electromagnetic radiation outside of the visible spectrum, for example infrared radiation. It will be appreciated that in the above description the term "radiation" is synonymous with the term "light". Any reference to light may therefore encompass electromagnetic radiation outside of the visible spectrum.

Note that this arrangement chooses to use one polarization for illumination in each colour. Measurements with two polarizations per colour could be made, by changing the polarization between readings (or by time division multiplexing within a reading). However, to maintain high throughput while benefiting from some diversity in colour and polarization, a set of different colours, each colour being linearly polarized and with one subset of the colours having one polarization direction and another subset of the colours having a different polarization direction, represents a good compromise between diversity and measurement throughput. To increase diversity without impacting throughput, one can envisage an implementation similar to the four-colour scheme presented here, but using more colours, for example eight or sixteen, with mixed polarizations.

The light for each path A and B is collected by a respective collector lens assembly 484A and 484B. It then goes through an aperture 518A or 518B that eliminates most of the light from outside the spot on the substrate. Two multimode fibres 520A and 520B transport the collected light of each path to respective demultiplexers 522A and 522B. The demultiplexers 522A, 522B split each path in the original four colours, so that a total of eight optical signals are delivered to detectors 430A and 430B within detector arrangement 430. In one practical embodiment, fibres are arranged between the demultiplexers and eight detector elements on a detector circuit board. The detectors in this example provide no spatial resolution, but deliver time-varying intensity signals $I_A$ and $I_B$ for each colour, as the apparatus scans the alignment mark 202 on substrate W. The signals are actually position-dependent signals, but received as time-varying signals (waveforms) synchronized with the physical scanning movement between the apparatus and the alignment mark (recall FIG. 3).

Processing unit PU receives the intensity waveforms from the eight detectors and processes these as in the known apparatus to provide a position measurement POS. Because there are eight signals to choose from, based on different wavelengths and incident polarizations, the apparatus can obtain useable measurements in a wide variety of situations. In this regard it should be remembered that the alignment mark 202 may be buried under a number of layers of different materials and structures. Some wavelengths will penetrate different materials and structures better than others. The processing unit PU conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations. In more advanced systems an automatic selection can be made, using "Color Dynamic" or "Smooth Color Dynamic" algorithms to identify the best signals without prior knowledge. This is described by Jeroen Huijbregtse et al in "Overlay Performance with Advanced ATHENATM Alignment Strategies", Metrology, Inspection, and Process Control for Microlithography XVII, Daniel J. Herr, Editor, Proceedings of SPIE Vol. 5038 (2003).

Each lens 484A, 484B focuses the entire field onto each element of each detector 430A, 430B, which is an arrangement similar to the known alignment sensor of FIG. 3. The detectors in this example and in the known alignment sensor are effectively single photodiodes and do not provide any spatial information except by the scanning motion described already. A detector having spatial resolution in a conjugate pupil plane can be added, if desired. This may, for example, allow angle-resolved scatterometry methods to be performed using the alignment sensor hardware.

The alignment mark may need to be scanned more than once if it is desired for example to measure a position using two different polarizations. Also it may be required to switch the illumination mode midway through scanning the XY alignment mark. In other embodiments, however, multiplexing of optical signals may be used so that two measurements can be made simultaneously. Similarly, multiplexing can be applied so that different portions of the XY alignment mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at each detector 430A, 430B will be a mixture of two signals, but they can be separated electronically using filters tuned to the respective frequencies of the source radiation. Time division multiplexing could also be used, but this would require accurate synchronization between source and detector. The modulation at each frequency can be a simple sine or square wave, for example.

If it is desired to illuminate an alignment mark with circular polarization, whether for position sensing or some other form of metrology, a quarter wave plate (not shown) may be inserted between beam splitter 454 and objective 424. This has the effect of turning a linear polarization into a circular one (and changing it back again after diffraction by the alignment mark). The spot positions are chosen as before according to the alignment mark direction. The direction of circular polarization (clockwise/counter clockwise) can be changed by selecting a different linear polarization in the illumination source 420, optical fibres 442 or illumination profiling optics 446.

Also described in the paper by Huijbregtse et al is the use of multiple gratings in a composite target. Each grating has a different profile, enhancing for example higher diffraction orders (3rd, 5th, 7th). Position measurements can be derived from different ones of these gratings, as well as from different colour signals on an individual grating. In the present disclosure, it is assumed that there is a single grating with a simple bar pattern, but having segmented features. The skilled reader can readily expand the disclosure to envisage embodiments having multiple gratings with different patterns.

Figure 5:
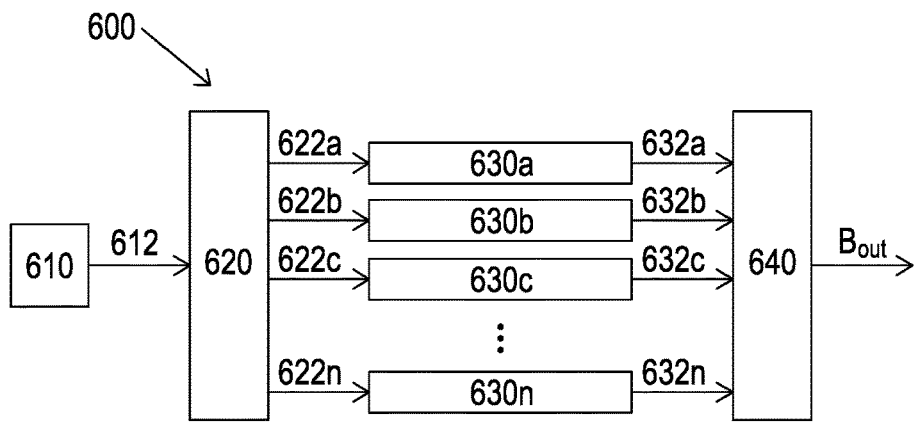
FIG. 5 is a schematic representation of a supercontinuum radiation source according to an embodiment of the present invention, which may form part of the alignment sensors of FIGS. 3 and 4.

FIG. 5 is a schematic representation of a supercontinuum radiation source 600 according to an embodiment of the present invention. The supercontinuum radiation source 600 comprises a radiation source 610, illumination optics 620, a plurality of waveguides 630a-630n and collection optics 640.

The radiation source 610 is operable to produce a pulsed radiation beam. In the following, the radiation source 610 may be referred to as a pump radiation source 610 and the pulsed radiation beam 612 may be referred to as a pump radiation beam 612. It will be appreciated that a pulsed radiation beam 612 comprises a plurality of sequential, discrete and temporally separated pulses of radiation. The pulsed radiation beam may, typically, have a generally constant pulse frequency, which may be of the order of 20-80 MHz. The pump radiation source 610 may comprise a laser. The laser may, for example, comprise a mode-locked laser. Suitable lasers may include fibre lasers such as, for example a ytterbium-doped (Yb-doped) fibre laser. Other suitable lasers may include a titanium-sapphire (Ti:Sapphire) laser. The individual pulses of radiation may have a duration of the order of 0.1-1 picoseconds.

The illumination optics 620 is arranged to receive the pulsed pump radiation beam 612 and to form a plurality of pulsed sub-beams 622a-622n. Each pulsed sub-beam 622a-622n comprises a portion of the pulsed pump radiation beam 612. Each of the plurality of waveguides 630a-630n is arranged to receive at least one of the plurality of pulsed sub-beams 622a-622n. In the embodiment shown in FIG. 5, each of the plurality of waveguides 630a-630n is arranged to receive a different one of the plurality of pulsed sub-beams 622a-622n. For example, first waveguide 630a of the plurality of waveguides receives first pulsed sub-beam 622a of the plurality of pulsed sub-beams, second waveguide 630b of the plurality of waveguides receives second pulsed sub-beam 622b of the plurality of pulsed sub-beams, etc. In this way the pulsed pump radiation beam 612 is split in a passive way into a plurality of portions each of which is received by one of the plurality of waveguides, and the power of the pulsed pump radiation beam 612 is spread over the plurality of waveguides.

Each of the plurality of waveguides 630a-630n is arranged such that, as its corresponding pulsed sub-beam 622a-622n propagates through the waveguide 630a-630n, the spectrum of that pulsed sub-beam 622a-622n is broadened so as to generate a supercontinuum sub-beam 632a-632n. The supercontinuum radiation source 600 therefore comprises a plurality of waveguides 630a-630n which have suitable non-linear optical properties to allow for the generation of a supercontinuum in each of the plurality of waveguides 630a-630n.

It will be appreciated that as used here the term "waveguide" means a structure that is configured to guide a wave, in particular an electromagnetic wave. Such a waveguide may form part of an integrated optical system, i.e. it may be provided "on-chip". Alternatively, such a waveguide may be free space waveguides. Free space waveguides include various different types of optical fibres including, for example, photonic crystal fibres.

The collection optics 640 is arranged to receive the supercontinuum sub-beams 632a-632n from the plurality of waveguides 630a-630n and to combine them so as to form a supercontinuum radiation beam $B_{out}$, which is output by the supercontinuum radiation source 600.

The supercontinuum radiation source 600 may be particularly suitable for use within an alignment mark measurement system. For example, the supercontinuum radiation source 600 may correspond to the illumination source 220, 420 shown in FIGS. 2 and 4 respectively and the supercontinuum radiation beam $B_{out}$ may correspond to the radiation beams 222, 422. However, the supercontinuum radiation source 600 may also be suitable for use within other optical measurement systems e.g. in a semiconductor inspection apparatus. Further examples of applications of the supercontinuum radiation source 600 are fiber inspection, interferometry or spectroscopy, medical applications such as optical coherence tomography, confocal microscopy, etc.

The supercontinuum radiation source 600 is operable to produce a supercontinuum radiation beam $B_{out}$ with a relatively broad spectrum. For example, the supercontinuum radiation beam $B_{out}$ with may have a spectrum that extends from the visible range to far infrared, for example the spectrum may extend from 400 nm to 2500 nm. Such a radiation beam $B_{out}$ is particularly useful for alignment mark measurement systems, for example the alignment sensors shown in FIGS. 3 and 4.

One advantage of using a plurality of waveguides 630a-630n for the supercontinuum generation is that the supercontinuum radiation source 600 has some level of redundancy and can still operate to some extend even in the event of failure of one of the plurality of waveguides 630a-630n.

Supercontinua are formed as a result of various non-linear optical effects as the pulses of radiation propagate through a waveguide. Due to the inherent non-linear nature of these effects even if its pump radiation source that produces these pulses was stable, such that its output radiation beam had substantially no pulse-to-pulse variations, supercontinuum radiation sources typically suffers from spectrum noise, pulse-to-pulse fluctuations, and fluctuations in the output mode.

The supercontinuum radiation source 600 provides an arrangement wherein a plurality of supercontinua 632a-632n are generated (one in each of the plurality of waveguides 630a-630n) and are superimposed (by the collection optics 640). Such an arrangement is advantageous over prior art arrangements since the noise and pulse to pulse variation within the different individual supercontinua 632a-632n will at least partially cancel each other out. The arrangement therefore provides a broad spectrum radiation source of the type that is suitable for use in alignment mark measurement systems which has a more stable output than prior art arrangements.

Generally, a waveguide will be able to support radiation provided that the intensity of the radiation (i.e. the power per unit area) is below a threshold value for that waveguide. If radiation with an intensity above the threshold value is coupled to the waveguide, it can be damaged. By splitting the pulsed pump radiation beam 612 into a plurality of sub-beams 622a-622n, each of which propagates through a different waveguide to generate the supercontinuum, the supercontinuum radiation source 600 allows the power of the pulsed pump radiation beam 612 to be spread over the plurality of waveguides 630a-630n. This means that, the cross sectional area of each of the plurality of waveguides 630a-630n can be reduced relative to those of the single waveguide in prior art supercontinuum sources for a given desired output power of the source.

It may be desirable to provide a broadband radiation source with a relatively high output power, for example of the order of 1 W. Known supercontinuum radiation sources with an output power of this order are possible by using, for example, a photonic crystal fibre as a non-linear optical medium.

In some embodiments of the present invention, even for a relatively bright supercontinuum radiation source 600 (for example, with a power of the order of 1 W or above) the dimensions of the waveguides can be reduced sufficiently such that the waveguides can comprise integrated optics. That is, the waveguides may be provided on chip (e.g. as an integrated optical system) and may be formed using semiconductor fabrication techniques. For example, the supercontinuum radiation source 600 may have an output power of the order of 1 W. To achieve this, the pump radiation source 610 may provide an input power of around 2-10 W, or slightly more, so as to account for power losses through the supercontinuum radiation source 600. The supercontinuum radiation source 600 may comprise of the order of 1000 waveguides 630a-630n such that each waveguide 630a-630n supports a sub-beam 622a-622n with a power of the order of 1 mW (for example in the range 2-10 mW). Radiation beams with a power of the order of 1 mW can allow the dimensions of the waveguides 630a-630n to be reduced sufficiently that the waveguides 630a-630n can comprise integrated optics.

Figure 6A:
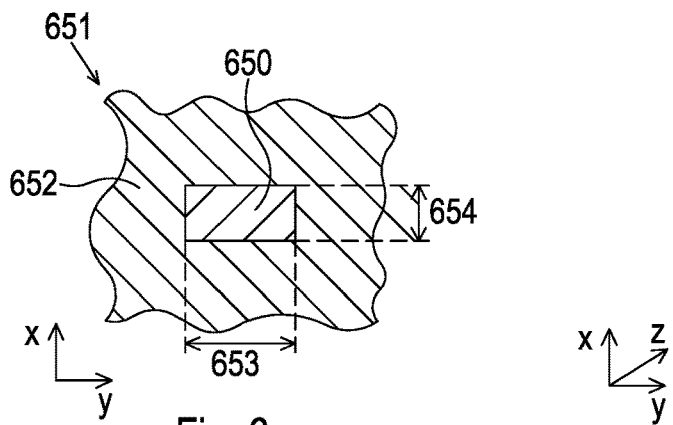
FIG. 6a is a cross sectional view of a portion of a waveguide provided as part of an integrated optical system in a plane (the x-y plane) perpendicular to an optical axis of the waveguide (the z direction) along which radiation propagates through waveguide in use.

FIG. 6a shows a cross sectional view of a portion of a waveguide 650 provided as part of an integrated optical system 651 in a plane (the x-y plane) perpendicular to an optical axis of the waveguide 650 (i.e. in a plane perpendicular to the direction along which radiation propagates through waveguide 650 in use). Any or all of the plurality of waveguides 630a-630n shown in FIG. 5 may be generally of the form of waveguide 650.

The waveguide 650 is formed from a suitable non-linear optical material such as, for example, silicon nitride ($Si_3N_4$) and is surrounded by a cladding material 652 such as, for example, silicon or silicon dioxide ($SiO_2$).

It will be appreciated that the waveguide 650 extends generally in the direction perpendicular to the plane of FIG. 6a (i.e. the z direction). The cross sectional shape and size of the waveguide 650 may be generally constant along its extent in the z direction. To illustrate this, FIG. 6b shows a partial cross sectional view of a portion of the waveguide 650 shown in FIG. 6a, with the cladding material 652 not shown.

The waveguide 650 may have a width 653 of the order of 1 μm or less and may have a height 654 of the order of a few 100 nm. The waveguide may extend in the z direction over a distance of the order of a few millimetres.

The waveguide 650 may be formed at least partially using semiconductor fabrication techniques. For example, a layer of resist may be applied to a substrate formed from the cladding material 652 and the resist may be patterned using lithographic techniques. This may then be used to selectively etch out a trench in the cladding material 652 for receipt of waveguide 650. Note that the resist may be patterned so that with a plurality of trenches (each for receipt of a different waveguide) may be formed simultaneously during the etching process. For example, the plurality of waveguides 630a-630n of supercontinuum radiation source may be formed on a common substrate. The waveguide 650 may be formed by depositing material (for example silicon nitride) into the trenches formed during the etching process. For example, silicon nitride may be deposited, for example using low pressure chemical vapour deposition (LPCVD) techniques so as to form a high quality solid waveguide 650 from the silicon nitride. Finally, a layer of the cladding material 652 may be applied over the waveguides 650 and surrounding cladding material 652 so as to fully enclose the waveguides 650 in the cladding material 652.

Figure 6B:
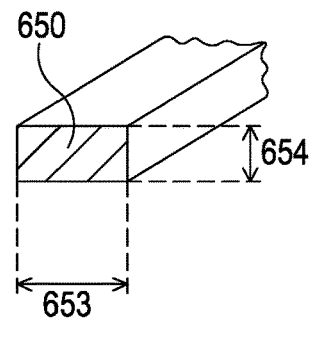
FIG. 6b shows a partial cross sectional perspective view of a portion of the waveguide 650 shown in FIG. 6a, with the cladding material not shown.

On chip waveguides, for example of the form of the waveguide 650 shown in FIGS. 6a and 6b, generally have smaller interaction lengths over which the non-linear processes that result in the supercontinuum generation can act than, for example, free space waveguides used for supercontinuum generation (for example, photonic crystal fibres). For example, on chip waveguides (for example of the form of the waveguide 650 shown in FIGS. 6a and 6b) may have a length of 10 mm or less.

In turn, this reduces the noise and pulse to pulse variation of the supercontinuum 632a-632n generated by each of the plurality of waveguides 630a-630n relative to those of the single waveguide in prior art supercontinuum sources.

Therefore the supercontinuum radiation source 600 allows a double improvement in output noise and pulse to pulse variation. Each individual supercontinuum 632a-632n can be generated with a more stable output than the prior art arrangement (for a given total output power) and, furthermore, the plurality of supercontinua 632a-632n are combined to at least partially average out noise and pulse to pulse fluctuations.

Furthermore, the properties of on chip waveguides allow the supercontinuum radiation source 600 to benefit from better mode control and polarization control over the supercontinuum radiation beam $B_{out}$ output by the supercontinuum radiation source 600. The properties of on chip waveguides that provide these benefits include: the relatively short interaction length of on chip waveguides, the refractive index contrast of integrated optics (between the waveguide material and cladding material), and the fabrication techniques for on chip waveguides.

The illumination optics 620 and collection optics 640 may take any one of a plurality of different forms, as now discussed with reference to FIGS. 7, 8a, 8b, 9a and 9b.

Figure 7:
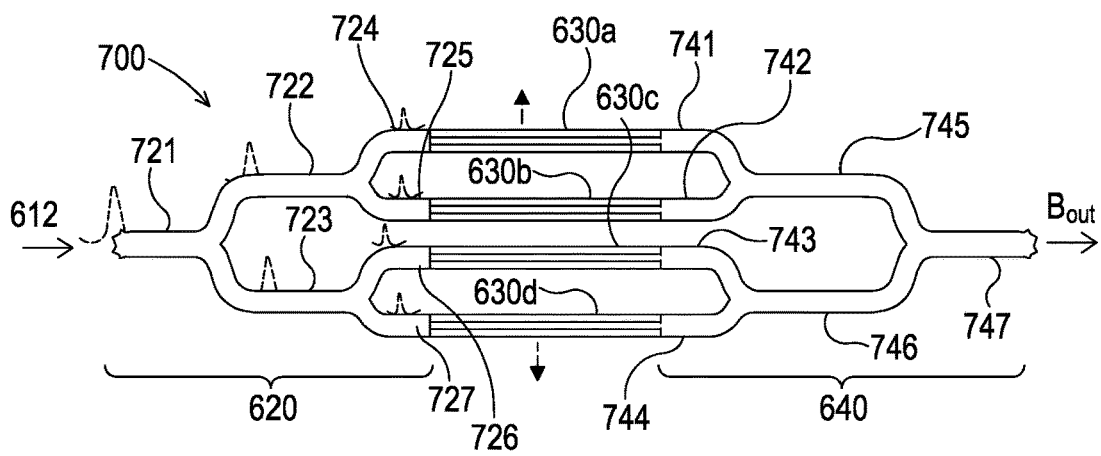
FIG. 7 shows a first embodiment of the supercontinuum radiation source of FIG. 5.

FIG. 7 shows a first embodiment 700 of the supercontinuum radiation source 600 of FIG. 5. In the embodiment shown in FIG. 7, as an example, only four supercontinuum generating waveguides 630a-630d are shown. In this first embodiment, the illumination optics 620 and the collection optics 640 are both implemented by a system of waveguides (which may be integrated optics or optical fibres).

The illumination optics 620 comprises a primary waveguide 721, two secondary waveguides 722, 723, and four tertiary waveguides 724-727. The primary waveguide 721 receives the pump radiation beam 612 and couples to the two secondary waveguides 722, 723, for example such that each of the two secondary waveguides 722, 723 receives half of the power of the pump radiation beam 612. In turn, each of the two secondary waveguides 722, 723 couples to two of the tertiary waveguides 724, 725 and 726, 727 respectively, for example such that each of the four tertiary waveguides 724-727 receives a quarter of the power of the pump radiation beam 612. Each of the four tertiary waveguides 724-727 couples to a different one of the four supercontinuum generating waveguides 630a-630d.

The illumination optics 620 shown in FIG. 7 comprises a plurality of levels, or stages, of waveguides, each level, or stage, having twice as many waveguides as compared to the previous level. For example, the primary waveguide 721 may be considered to be a first level, the secondary waveguides 722, 723 may be considered to be a second level and the tertiary waveguides 724-727 may be considered to be a third level. As explained above, in the embodiment shown in FIG. 7, only four supercontinuum generating waveguides 630a-630d are shown and therefore the illumination optics comprises three levels.

In this example embodiment, the radiation within each waveguide of a given level of the illumination optics 620 couples to two waveguides on the next level such that each of the two waveguides on the next level receives half of the power of the radiation. It will be appreciated that the radiation may be split between two waveguides on the next level in various different ways. For example, a different portion of the power of the radiation from a waveguide on a particular level may be coupled into each of the waveguides on the next level. Furthermore, in alternative embodiments the radiation within each waveguide of a given level may couple to more than two waveguides on the next level such that each of the more than two waveguides on the next level receives a desired fraction of the power of the radiation.

The collection optics 640 comprises four primary waveguides 741-744, two secondary waveguides 745, 746, and one tertiary waveguide 747. The primary waveguides 741-744 each receives a different one of the supercontinuum sub-beams 632a-632d output by one of the waveguides 630a-630d. Each of the two secondary waveguides 745, 746 couples to two of the primary waveguides 741, 742 and 743, 744 respectively such that each of the two secondary waveguides 745, 746 receives, and combines, two of the supercontinuum sub-beams 632a-632d. The tertiary waveguide 747 couples to the two secondary waveguides 745, 746 such that the tertiary waveguide 747 receives, and combines, all four of the supercontinuum sub-beams 632a-632d.

The collection optics 640 shown in FIG. 7 comprises a plurality of levels of waveguides, each level having half as many waveguides as the previous level. For example, the primary waveguides 741-744 may be considered to be a first level, the secondary waveguides 745, 746 may be considered to be a second level and the tertiary waveguide 747 may be considered to be a third level. As explained above, in the embodiment shown in FIG. 7, only four supercontinuum generating waveguides 630a-630d are shown and therefore the collection optics comprises three levels.

In this example embodiment, the radiation within each waveguide of a given level of the collection optics 640 couples to two waveguides on the next level such that each of the two waveguides on the next level receives half of the power of the radiation. It will be appreciated that the radiation may be split between two waveguides on the next level in various different ways. For example, a different portion of the power of the radiation from a waveguide on a particular level may be coupled into each of the waveguides on the next level. Furthermore, in alternative embodiments the radiation within each waveguide of a given level may couple to more than two waveguides on the next level such that each of the more than two waveguides on the next level receives a desired fraction of the power of the radiation.

In the embodiment shown in FIG. 7, only four supercontinuum generating waveguides 630a-630d are shown. It will of course be understood that this arrangement may be extended to incorporate more than four supercontinuum generating waveguides. It will be apparent to the skilled person that such extension may be achieved by the provision of illumination optics and collection optics of the same general form as those shown in FIG. 7 but each having more than three levels of waveguides.

The waveguides 721-727 and 741-747 that form the illumination optics 620 and the collection optics 640 may be single mode or multimode waveguides.

Furthermore, the waveguides 721-727 and 741-747 that form the illumination optics 620 and the collection optics 640 may comprise integrated optics, free space optics or a combination of both. As explained above, in some embodiments the supercontinuum radiation source 600 may comprise of the order of 1000 waveguides 630a-630n. Each of these waveguides 630a-630n may, for example, support a sub-beam 622a-622n with a power of the order of 1 mW. For such embodiments, the general form of the illumination optics and collection optics shown in FIG. 7 may be extended so that there are more than three levels of waveguides. For example, each of the illumination and collection optics may comprise 11 levels of waveguides, each level differing in number from the previous level by a factor of 2. Such an arrangement allows for there to be 1024 ($2^{10}$) supercontinuum generating waveguides 630a-630n. In general, the levels of waveguides in the illumination and collection optics 620, 640 that have a sufficiently low power may be implemented as integrated optics. For example, the levels of waveguides that are closest to the supercontinuum generating waveguides 630a-630n may be implemented as integrated optics. In general, the levels of waveguides in the illumination and collection optics 620, 640 that have a sufficiently high power so as to render their implementation as integrated optics impractical may be implemented as free space optics. For example, the levels of waveguides that are farthest from the supercontinuum generating waveguides 630a-630n may be implemented as integrated optics.

As discussed above, in alternative embodiments the radiation within each waveguide of a given level may couple to more than two waveguides on the next level such that each of the more than two waveguides on the next level receives a desired fraction of the power of the radiation. In one embodiment, the illumination optics 620 and collection optics 640 may be implemented such that a single waveguide couples directly to each of the supercontinuum generating waveguides 630a-630n. However, the arrangement described above, wherein each of the illumination and collection optics 620, 640 comprises a plurality of different levels may be easier to implement, particularly for embodiments which comprise a large number of supercontinuum generating waveguides 630a-630n (for example of the order of 1000).

Figure 8A:
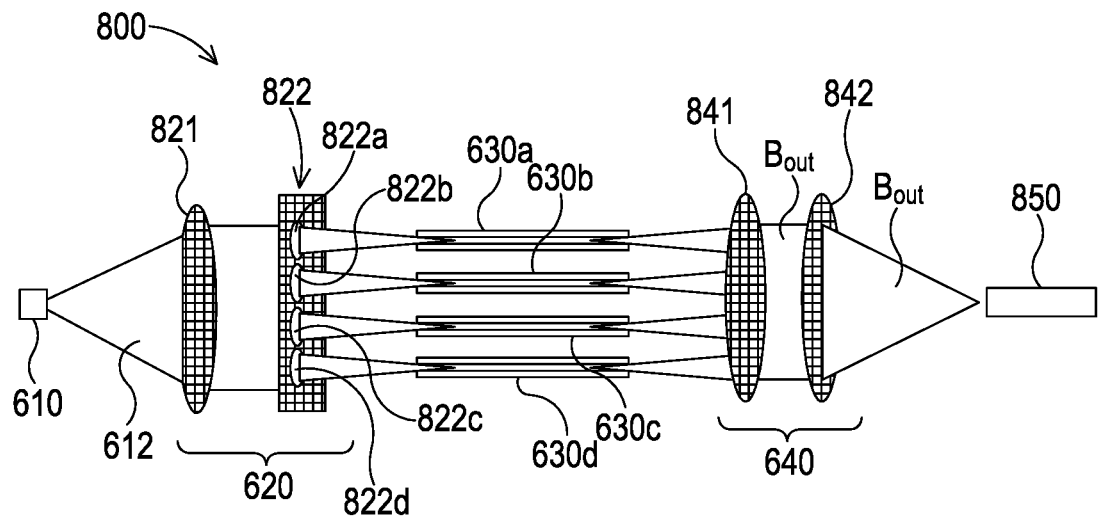
FIGS. 8a and 8b show two variations of a second embodiment of the supercontinuum radiation source of FIG. 5.
Figure 8B:
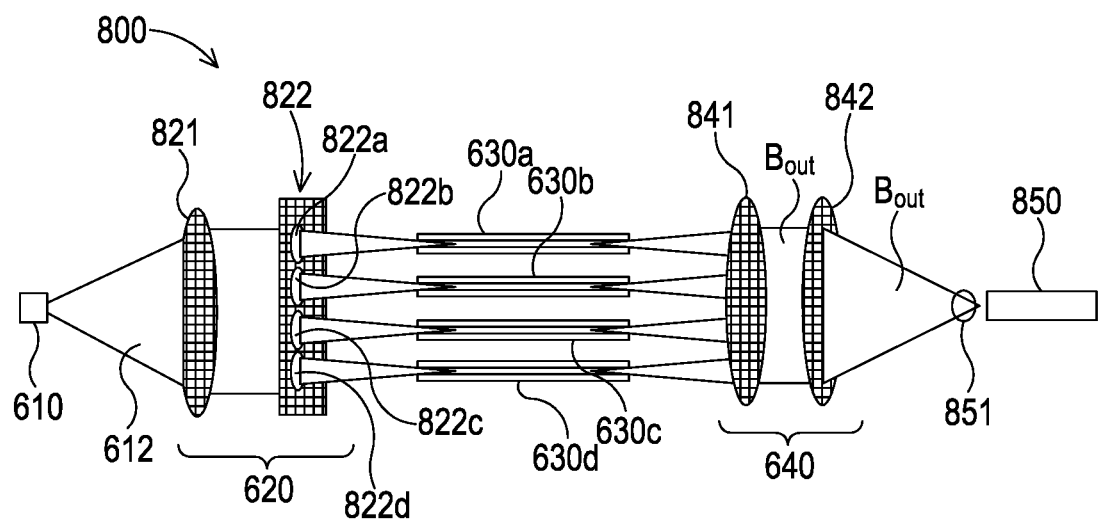

FIGS. 8a and 8b show two variations of a second embodiment 800 of the supercontinuum radiation source 600 of FIG. 5.

In the embodiment 800 shown in FIGS. 8a, 8b, only four supercontinuum generating waveguides 630a-630d are shown. As with the embodiment 700 shown in FIG. 7, this is merely to provide a specific illustrative example of this embodiment 800 and it will be apparent to the skilled person how the embodiment 800 of FIG. 8a, 8b may be extended to embodiments with more than (or fewer than) four supercontinuum generating waveguides. In this second embodiment, the illumination optics 620 and the collection optics 640 are both implemented by a system of lenses.

The illumination optics 620 in FIGS. 8a and 8b comprises a collimating optic 821 and a focusing optic 822.

The collimating optic 821 comprises a focusing lens (for example, a convex lens) that is arranged to receive the pump radiation beam 612 from the pump radiation source 610 and to collimate the pump radiation beam 612 and direct it onto the focusing optic 822. In particular, the collimating optic 821 may be arranged to substantially uniformly illuminate the focusing optic 822.

The focusing optic 822 is arranged to optically couple a different portion of the pump radiation beam 612 to each of the four supercontinuum generating waveguides 630a-630d. In particular, the focusing optic 822 is arranged to focus a different portion of the pump radiation beam 612 to a focal point at, or proximate to, an entrance to each of the four supercontinuum generating waveguides 630a-630d. In order to achieve this, the focusing optic 822 comprises an array of focusing lenses 822a-822d, each of which is arranged to focus a different part of the pump radiation beam 612 to a focal point at, or proximate to, an entrance to each of the four supercontinuum generating waveguides 630a-630d. The array of focusing lenses 822 may comprise a one dimensional array or a two dimensional array. Each focusing lens 822a-822d may comprise, for example, a spherical lens. Each of the individual focusing lenses 822a-822d may comprise a micro-lens. A micro-lens may be a lens with a diameter less than 1 mm.

In general, the focusing optic 822 may be implemented using integrated optics or free space optics. It will be appreciated that the embodiment described above wherein the focusing optic 822 comprises an array of focusing micro-lenses 822a-822d is only one example of a suitable focusing optic 822. This array of focusing micro-lenses 822a-822d may be relatively simple to implement. Since the pump radiation beam 612 may be monochromatic, in an alternative embodiment, the focusing optic 822 may comprise an optical system that is arranged produce a diffraction pattern that comprises an array of maxima, each maximum coinciding with one of the supercontinuum generating waveguides 630a-630d. These maxima may each comprise a different portion of the pump radiation beam 612 and may be focused to a focal point at, or proximate to, an entrance to each of the four supercontinuum generating waveguides 630a-630d. Suitable optical systems for implementing such a focusing optic 822 may comprise one or more of the following: a diffraction grating, a spatial light modulator (SLM), or an array of Fresnel lenses.

The collection optics 640 in FIGS. 8a and 8b comprises a collimating optic 841 and a focusing optic 842.

The collimating optic 841 comprises a focusing lens (for example, a convex lens) that is arranged to receive the supercontinuum sub-beams 632a-632n from each of the plurality of waveguides 630a-630n and to collimate them. In alternative embodiments the collimating optic 841 may comprise any multicolour focusing optics, including concave mirrors. The collimating optic 841 is arranged such that the so collimated supercontinuum sub-beams 632a-632n are spatially adjacent such that they are effectively combined so as to form the supercontinuum radiation beam $B_{out}$, which is output by the supercontinuum radiation source 800.

The collimating optic 841 is arranged to direct the supercontinuum radiation beam $B_{out}$ onto the focusing optic 842. In turn, the focusing optic 842 is arranged to optically couple the supercontinuum radiation beam $B_{out}$ to an optical fibre 850, which may direct the supercontinuum radiation beam $B_{out}$ to an apparatus that uses the supercontinuum radiation beam $B_{out}$ (for example an alignment sensor). The focusing optic 842 comprises a focusing lens, for example a convex lens.

In the embodiment 800 shown in FIGS. 8a and 8b, only four supercontinuum generating waveguides 630a-630d are shown. It will of course be understood that this arrangement may be extended to incorporate more than four supercontinuum generating waveguides.

The optical fibre 850 may be single mode or multimode waveguide. In the arrangement shown in FIG. 8a, the focusing optic 842 couples directly into the optical fibre 850. Such an arrangement may be suitable for multimode output of the supercontinuum radiation beam $B_{out}$. In the arrangement shown in FIG. 8b, the focusing optic 842 couples into the optical fibre 850 via a pinhole aperture 851. Such an arrangement may be suitable for single mode output of the supercontinuum radiation beam $B_{out}$. The pinhole aperture 851 acts as a spatial filter. Such a pinhole aperture or a single mode waveguide can be used as a wave-front filter. The pinhole aperture 851 can be arranged to eliminate the high spatial frequency wave-front defects of a focused wave. Advantageously, the attenuation of such pinhole apertures 851 is relatively independent of the wavelength of the radiation such that the pinhole aperture 851 does not significantly affect the overall shape of the spectrum of the supercontinuum radiation beam $B_{out}$.

Figure 9A:
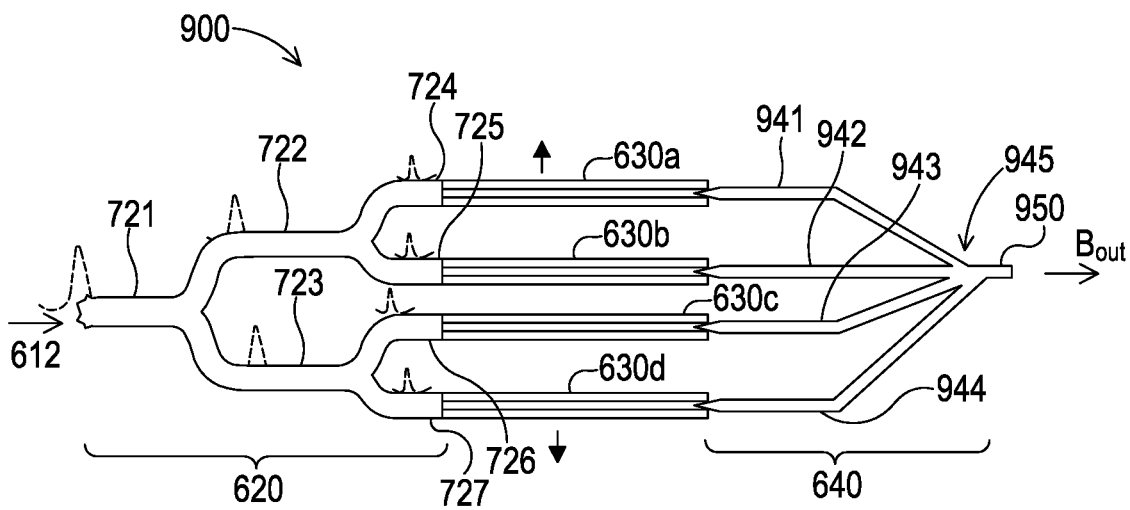
FIGS. 9a and 9b show two variations of a third embodiment of the supercontinuum radiation source of FIG. 5.
Figure 9B:
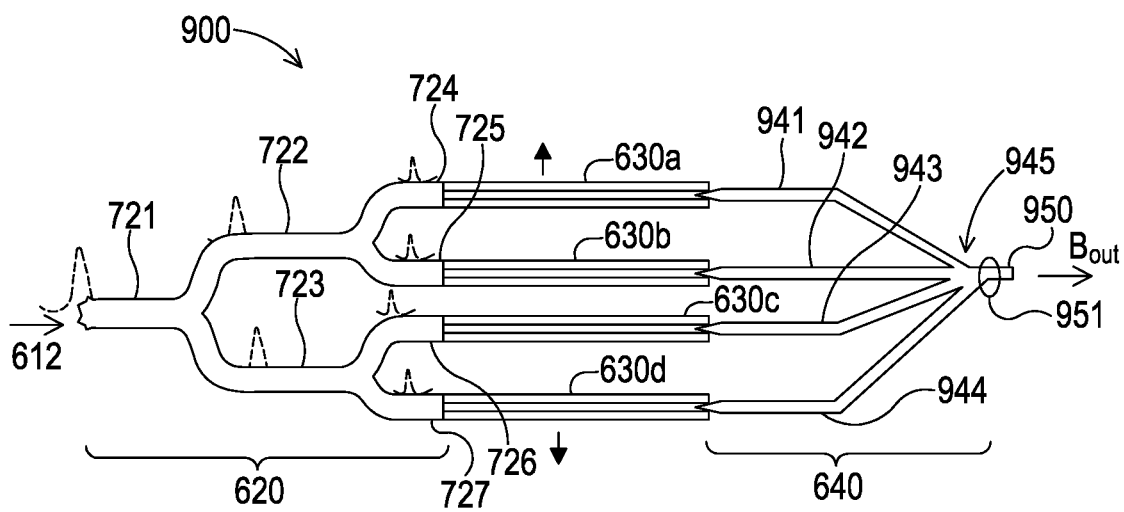

FIGS. 9a and 9b show two variations of a third embodiment 900 of the supercontinuum radiation source 600 of FIG. 5.

In the embodiment 900 shown in FIGS. 9a, 9b, only four supercontinuum generating waveguides 630a-630d are shown. As with the embodiment 700 shown in FIG. 7, this is merely to provide a specific illustrative example of this embodiment 900 and it will be apparent to the skilled person how the embodiment 900 of FIG. 8a, 8b may be extended to embodiments with more than (or fewer than) four supercontinuum generating waveguides. In this second embodiment, the illumination optics 620 and the collection optics 640 are both implemented by a system of optical fibres or waveguides.

The illumination optics 620 is generally of the form shown in FIG. 7 and described above and will not be described further here.

The collection optics 640 comprises four lensed fibres 941-944. Each of the lensed fibres 941-944 (also known as tapered fibres) couples to a different one of the supercontinuum generating waveguides 630a-630d such that it receives the supercontinuum sub-beam 632a-632d output by that waveguide 630a-630d. Such an arrangement is beneficial since the coupling between such lensed fibres 941-944 and the supercontinuum generating waveguides 630a-630d is particularly efficient. The lensed fibres 941-944 may be matched to the fundamental mode of the supercontinuum generating waveguides 630a-630d.

The four lensed fibres 941-944 are all optically coupled to an output optical fibre 950 such that each of the supercontinuum sub-beam 632a-632d propagates from one of the four lensed fibres 941-944 into the output optical fibre 950. This may be achieved using a coupling 945 which may comprise, for example, one or more fused fibre optic couplings.

The coupling 945 is arranged such that the supercontinuum sub-beams 632a-632d are effectively combined so as to form the supercontinuum radiation beam $B_{out}$, which is output by the supercontinuum radiation source 900 via output optical fibre 950.

In the embodiment 900 shown in FIGS. 9a and 9b, only four supercontinuum generating waveguides 630a-630d are shown. It will of course be understood that this arrangement may be extended to incorporate more than four supercontinuum generating waveguides.

The optical fibre 950 may be single mode or multimode waveguide. In the arrangement shown in FIG. 9a, the output optical fibre 950 is a multimode fibre suitable for outputting a multimode supercontinuum radiation beam $B_{out}$. In the arrangement shown in FIG. 9b, after the coupling 945, the output optical fibre 950 is provided with a pinhole aperture 951. In this way, the output from the (multimode) optical fibre 950 can be spatially filtered by the pinhole aperture 951. The pinhole aperture 951 may be disposed proximate to an end of the optical fibre 950 and the supercontinuum sub-beams 632a-632d propagating from the four lensed fibres 941-944 may be focused at, or proximate to, the pinhole aperture 951. This may, for example, be achieved using focusing optics (for example lenses) disposed between the lensed fibres 941-944 and the pinhole aperture 951 to couple the light into the optical fibre 950. Such an arrangement may be suitable for single mode output of the supercontinuum radiation beam $B_{out}$.

In some embodiments of the present invention, the collection optics 640 may comprise one or more light mixing rods. The light mixing rods may, for example, be generally of the form disclosed in published patent applications WO2013/088295 and WO2013/114259. The light mixing rods may, for example, comprise one of the products marketed by Synopsys' Optical Solutions Group, Edmund Optics Inc. of Barrington USA or SCHOTT AG Lighting and Imaging of Mainz Germany. Light mixing rods are extruded rods that exploit multiple internal reflections to homogenize a light beam. Typical light mixing rods are made of transparent plastic and in the order of 1 cm in diameter and 10 cm long. An inhomogeneous light beam enters the mixing rod at one of the ends, is totally internally reflected (multiple times) along the length of the mixing rod and exits on the opposite end of the mixing rod. The emitted light beam is typically more homogeneous than the incident beam. The mixing performance depends strongly on the cross-sectional shape of the mixing rod. Traditional mixing rods have e.g. circular, square or hexagonal shapes and lead to moderate mixing. The light mixing rod may for example be an elongate element comprising a cross-sectional shape (transverse to its length) which is neither a circle nor a regular polygon, but e.g. of a chaotic billiard cross-sectional shape. These mixing rods lead to strongly enhanced homogenization of incoherent light beams, as disclosed in published patent applications WO2013/088295 and WO2013/114259.

Light mixing rods are extruded rods that exploit multiple internal reflections to homogenize a light beam. These known optical elements are suitable for combining and/or mixing multiple input beams and forming a homogenous output beam. Since light mixing rods comprise a scattering material they can result in a temporal broadening of the pulses of radiation output by the supercontinuum radiation source 600. Typical light mixing rods are made of transparent plastic and in the order of 1 cm in diameter and 10 cm long. An inhomogeneous light beam entering the mixing rod at one of its ends is multiply totally internally reflected along the mixing rod and exits the mixing rod at an opposed end of the light mixing rod. The light beam profile that exits the light mixing rod is typically more homogeneous than the incident beam. The mixing performance is dependent on the cross-sectional shape of the mixing rod. Light mixing rods may, for example, be circular, square or hexagonal in cross-section. Such arrangements may lead to moderate mixing. A greater level of light mixing may, for example, be achieved using chaotic billiard cross-sectional shapes. Such mixing rods (using chaotic billiard cross-sectional shapes) lead to strongly enhanced homogenization of incoherent light beams.

The arrangements 700, 800, 900 shown in FIGS. 7, 8a, 8b, 9a and 9b show examples of illumination optics 620 that provide a passive coupling from the pump radiation source 610 to the supercontinuum generating waveguides 630a-630n and the collection optics 640 that provide a coupling between the supercontinuum generating waveguides 630a-630n and the output of the supercontinuum radiation source 600. It will be appreciated that illumination optics 620 and the collection optics 640 are not limited to these embodiments and that either or both may be embodied by alternative optical couplings. In particular, two or more of the optical couplings described above in FIGS. 7, 8a, 8b, 9a and 9b may combined as desired.

It will be appreciated that a radiation source is a source operable to emit radiation, for example electromagnetic radiation. The radiation may comprise visible light. Therefore, it will be appreciated that the term "radiation" may be synonymous with the term "light".

Although specific reference has been made to the alignment method being used with position measurement apparatus, it is to be understood that the method of measuring asymmetries described herein may also be used to measure overlay between multiple layers of a substrate. For example, the method may be applied when measuring an overlay between coarse and fine features of different layers of a substrate.

Although specific reference may be made in this text to embodiments of the radiation source according to the invention in the context of an alignment measurement system, embodiments of the radiation source may be used advantageously in other optical measurement systems as well, for example in a semiconductor inspection apparatus in general. Furthermore, the radiation source according to the invention, being a supercontinuum source generating a broad spectrum with a relatively low noise, may be applied advantageously in other technical fields than lithography, such as, for example, medical tomography, measurement of fibres or component attenuation, interferometry or spectroscopy, optical coherence tomography, confocal microscopy, nanotechnology, biomedicine, consumer electronics, etc.

Although specific reference may be made in this text to embodiments of the invention in the context of a lithographic apparatus, embodiments of the invention may be used in other apparatus. A radiation source according to embodiments of the present invention may, for example, be used for medical applications, for example as part of a metrology system within a medical device. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the lithographic apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including infrared radiation (e.g. having a wavelength between 800 nm-2.5 µm), visible ration (e.g. having a wavelength between 380 nm-800 nm), ultraviolet (UV) radiation (e.g. having a wavelength of 365, 248, 193, 157 or 126 nm) and extreme ultra-violet (EUV) radiation (e.g. having a wavelength in the range of 5-20 nm). In the context of exposure of a substrate, for example using the lithographic apparatus shown in FIG. 1A, the terms "radiation" and "beam" may include: ultra-violet (UV) radiation (e.g. having a wavelength of 365, 248, 193, 157 or 126 nm) and extreme ultra-violet (EUV) radiation (e.g. having a wavelength in the range of 5-20 nm) and particle beams, such as ion beams or electron beams. In the context of the supercontinuum radiation beam $B_{out}$ output by the supercontinuum radiation source 600 shown in FIG. 5, the terms "radiation" and "beam" may include: infrared radiation (e.g. having a wavelength between 800 nm-2.5 µm) and visible ration (e.g. having a wavelength between 380 nm-800 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A supercontinuum radiation source comprising:
   illumination optics arranged to receive a pulsed pump radiation beam having a power and to form a plurality of pulsed sub-beams, each pulsed sub-beam comprising a portion of the pulsed pump radiation beam;
   a plurality of waveguides each arranged to receive at least one of the plurality of pulsed sub-beams and to broaden a spectrum of that pulsed sub-beam so as to generate a supercontinuum sub-beam wherein the power of the pulsed pump radiation beam is spread over the plurality of waveguides; and
   collection optics arranged to receive the supercontinuum sub-beam from the plurality of waveguides and to combine them so as to form a supercontinuum radiation beam,
   wherein the pulsed pump radiation beam is passively coupled into the plurality of waveguides and through the plurality of waveguides without applying any amplification.

2. The supercontinuum radiation source of claim 1, wherein the plurality of waveguides comprise integrated optics.

3. The supercontinuum radiation source of claim 2, wherein the plurality of waveguides are formed from silicon nitride (Si3N4) and are surrounded by a cladding material or silicon or silicon dioxide (SiO2).

4. The supercontinuum radiation source of claim 2, wherein the plurality of waveguides are formed on a common substrate.

5. The supercontinuum radiation source of claim 2, wherein the plurality of waveguides have a width of the order of 1 µm or less and a height of the order of 500 nm or less.

6. The supercontinuum radiation source of claim 2, wherein each of the plurality of waveguides has a length of 10 mm or less.

7. The supercontinuum radiation source of claim 1, wherein the supercontinuum radiation beam has a spectrum which comprises radiation in the wavelength range of 400 to 2600 nm.

8. The supercontinuum radiation source of claim 1, comprising 100 or more waveguides.

9. The supercontinuum radiation source of claim 1, wherein the illumination optics and/or the collection optics comprises a plurality of groups of waveguides, the plurality of groups of waveguides being sequentially ordered and wherein the waveguides from each group of waveguides optically couple to a plurality of waveguides in the next group of waveguides in the sequence.

10. The supercontinuum radiation source of claim 1, wherein the illumination optics and/or collection optics comprises a plurality of lensed fibers, each of the lensed fibers coupling to at least one of the plurality of waveguides.

11. The supercontinuum radiation source of claim 1, wherein:
   the illumination optics comprises a first optic and a focusing optic,
   the first optic is arranged to receive the radiation beam from the radiation source and to direct it onto the focusing optic, and
   the focusing optic is arranged to optically couple a different portion of the pump radiation beam to at least two of the plurality of waveguides.

12. An optical measurement system comprising:
   a supercontinuum radiation source comprising:
      illumination optics arranged to receive a pulsed pump radiation beam having a power and to form a plurality of pulsed sub-beams, each pulsed sub-beam comprising a portion of the pulsed pump radiation beam;

a plurality of waveguides each arranged to receive at least one of the plurality of pulsed sub-beams and to broaden a spectrum of that pulsed sub-beam so as to generate a supercontinuum sub-beam wherein the power of the pulsed pump radiation beam is spread over the plurality of waveguides; and collection optics arranged to receive the supercontinuum sub-beam from the plurality of waveguides and to combine them so as to form a supercontinuum radiation beam, wherein the pulsed pump radiation beam is passively coupled into the plurality of waveguides and through the plurality of waveguides without applying any amplification.

13. An alignment mark measurement system comprising:
a supercontinuum radiation source comprising:
   illumination optics arranged to receive a pulsed pump radiation beam having a power and to form a plurality of pulsed sub-beams, each pulsed sub-beam comprising a portion of the pulsed pump radiation beam;
   a plurality of waveguides each arranged to receive at least one of the plurality of pulsed sub-beams and to broaden a spectrum of that pulsed sub-beam so as to generate a supercontinuum sub-beam wherein the power of the pulsed pump radiation beam is spread over the plurality of waveguides; and
   collection optics arranged to receive the supercontinuum sub-beam from the plurality of waveguides and to combine them so as to form a supercontinuum radiation beam,
   wherein the pulsed pump radiation beam is passively coupled into the plurality of waveguides and through the plurality of waveguides without applying any amplification;
an optical system operable to project the supercontinuum radiation beam onto an alignment mark on a substrate supported on a substrate table;
a sensor operable to detect radiation diffracted/scattered by the alignment mark and to output a signal containing information related to a position of the alignment mark; and
a processor configured to receive the signal from the sensor and to determine a position of the alignment mark relative to the substrate table in dependence thereon.

14. A lithographic apparatus comprising the alignment mark measurement system according to claim 13.

* * * * *